United States Patent
Beon et al.

(10) Patent No.: US 12,096,677 B2
(45) Date of Patent: *Sep. 17, 2024

(54) DISPLAY DEVICE WITH FINGERPRINT RECOGNITION

(71) Applicant: SAMSUNG DISPLAY CO., LTD., Yongin-si (KR)

(72) Inventors: Beong Hun Beon, Hwaseong-si (KR); Woo Suk Jung, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/062,050

(22) Filed: Dec. 6, 2022

(65) Prior Publication Data
US 2023/0180579 A1    Jun. 8, 2023

Related U.S. Application Data

(63) Continuation of application No. 16/749,077, filed on Jan. 22, 2020, now Pat. No. 11,521,420.

(30) Foreign Application Priority Data

May 14, 2019 (KR) .......................... 10-2019-0056289

(51) Int. Cl.
*H10K 59/65*  (2023.01)
*G06V 10/143*  (2022.01)
(Continued)

(52) U.S. Cl.
CPC .......... *H10K 59/65* (2023.02); *G06V 10/143* (2022.01); *G06V 40/1318* (2022.01);
(Continued)

(58) Field of Classification Search
CPC ..... G06F 3/042; G06F 3/0421; G06K 9/0004; G06K 9/00046; G06V 40/1318; H10K 59/65

See application file for complete search history.

(56) References Cited

U.S. PATENT DOCUMENTS 10,386,949 B2   8/2019   An et al.
10,540,033 B2   1/2020   An et al.
(Continued)

FOREIGN PATENT DOCUMENTS

JP   2017-016024   1/2017
KR   10-2009-0115028 A   11/2009
(Continued)

*Primary Examiner* — Yuzhen Shen
(74) *Attorney, Agent, or Firm* — F. CHAU & ASSOCIATES, LLC

(57) ABSTRACT

Systems and methods are described for a display device in which the recognition failure of a fingerprint recognition sensor disposed in a display area without being exposed to the outside is reduced. The display device comprises a display panel; a cover window disposed above the display panel; an optical sensor, wherein at least a part of the optical sensor is disposed under the display panel; and an infrared blocking member disposed between the optical sensor and the cover window and at least a part of which overlaps the optical sensor from above the optical sensor.

17 Claims, 20 Drawing Sheets

(51) Int. Cl.
*G06V 40/12* (2022.01)
*G06V 40/13* (2022.01)
*H10K 50/844* (2023.01)
*H10K 50/86* (2023.01)
*H10K 59/12* (2023.01)
*H10K 59/40* (2023.01)

(52) U.S. Cl.
CPC ....... *G06V 40/1365* (2022.01); *H10K 50/844* (2023.02); *H10K 50/86* (2023.02); *H10K 59/12* (2023.02); *H10K 59/40* (2023.02)

(56) References Cited

U.S. PATENT DOCUMENTS

| | | | |
|---|---|---|---|
| 10,824,840 | B2 | 11/2020 | Song et al. |
| 10,852,574 | B2* | 12/2020 | Wilson ................ H10K 50/865 |
| 11,763,593 | B2 | 9/2023 | Song et al. |
| 2011/0234945 | A1 | 9/2011 | Park et al. |
| 2012/0105400 | A1 | 5/2012 | Mathew et al. |
| 2012/0170284 | A1 | 7/2012 | Shedletsky |
| 2013/0038206 | A1 | 2/2013 | Aurongzeb |
| 2015/0036081 | A1 | 2/2015 | Beon et al. |
| 2016/0304730 | A1* | 10/2016 | Hitomi ................ C09D 163/04 |
| 2016/0306477 | A1 | 10/2016 | Lee et al. |
| 2017/0300736 | A1* | 10/2017 | Song ................... G06V 40/1312 |
| 2018/0080815 | A1* | 3/2018 | Nayak .................... G01J 1/0474 |
| 2018/0086029 | A1* | 3/2018 | Kamimura ................ C08F 8/04 |
| 2019/0205603 | A1* | 7/2019 | Lee ..................... G06V 40/1329 |
| 2019/0310724 | A1* | 10/2019 | Yeke Yazdandoost ..................... H10K 59/65 |
| 2020/0059578 | A1 | 2/2020 | Lee et al. |
| 2020/0364436 | A1 | 11/2020 | Yonathan |
| 2021/0004558 | A1* | 1/2021 | Zeng ..................... H05K 1/189 |

FOREIGN PATENT DOCUMENTS

| | | |
|---|---|---|
| KR | 10-2015-0014656 A | 2/2015 |
| KR | 10-2016-0124372 | 10/2016 |
| KR | 10-2017-0119623 A | 10/2017 |
| KR | 10-2018-0058284 A | 6/2018 |
| KR | 10-2019-0048828 A | 5/2019 |

* cited by examiner

DISPLAY DEVICE WITH FINGERPRINT RECOGNITION

This application claims priority from U.S. patent application Ser. No. 16/749,077, filed on Jan. 22, 2020 and Korean Patent Application No. 10-2019-0056289, filed on May 14, 2019 in the Korean Intellectual Property Office, and all the benefits accruing therefrom under 35 § 119, the disclosure of which is incorporated by reference herein in its entirety.

BACKGROUND

1. Field

The present disclosure relates to a display device.

2. Description of the Related Art

Demand for device display technology increases as the use of devices with displays becomes more prevalent. Display devices can be found in products such as smartphones, digital cameras, notebook computers, navigation devices, and smart televisions, among many others. These devices are subject to continuous technological advancement to keep up with consumer demand.

In some case, display devices may include a display panel for displaying an image and a fingerprint recognition sensor for optically sensing a signal input from an external source. The design of display devices can vary to based on different uses of an electronic device. For example, many smartphones include display devices with a fingerprint recognition area for recognizing a user's fingerprint in a display area.

A fingerprint recognition area is used to automatically identify or confirm the identity of an individual based on a comparison of an input fingerprint to an assigned fingerprint. A user will first assign a fingerprint to a device, and store it for future comparisons. The user then applies their fingerprint to gain access to the device. Each subsequent use of the fingerprint recognition area may either confirm or deny access to the device based on the comparison to the assigned fingerprint.

SUMMARY

Aspects of the present disclosure provide a display device in which the recognition failure of a fingerprint recognition sensor disposed in a display area without being exposed to the outside is reduced.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to an embodiment of the present discloser, a display device comprises a display panel; a cover window disposed above the display panel; an optical sensor disposed under at least a part of the display panel; and an infrared blocking member disposed between the optical sensor and the cover window, wherein at least a part of the infrared blocking member overlaps the optical sensor from above the optical sensor.

In an exemplary embodiment, the display device may comprise a display area and a non-display area outside the display area; and a fingerprint recognition area which overlaps the optical sensor from above the optical sensor.

In an exemplary embodiment, the fingerprint recognition area may be disposed in the display area.

In an exemplary embodiment, the infrared blocking member may be disposed between the optical sensor and the display panel.

In an exemplary embodiment, the display device may further comprise a polarizing film disposed between the display panel and the cover window.

In an exemplary embodiment, the infrared blocking member may be disposed between the polarizing film and the cover window.

In an exemplary embodiment, the display device may further comprise a first adhesive member disposed between the polarizing film and the cover window, wherein the first adhesive member comprises the infrared blocking member.

In an exemplary embodiment, the polarizing film may comprise a polarizer and a hard coating layer disposed on the polarizer, and the hard coating layer may comprise the infrared blocking member.

In an exemplary embodiment, the display panel may comprise a light emitting layer and a thin-film encapsulation layer disposed on the light emitting layer and may further comprise a touch member disposed on the thin-film encapsulation layer of the display panel.

In an exemplary embodiment, the thin-film encapsulation layer may comprise the infrared blocking member.

In an exemplary embodiment, the display device may further comprise a second adhesive member disposed between the display panel and the polarizing film, wherein the second adhesive member may comprise the infrared blocking member.

In an exemplary embodiment, the infrared blocking member may comprise a material that blocks transmission of infrared light and prevent light whose center wavelength ranges from 780 nm to 2500 nm from entering the optical sensor.

In an exemplary embodiment, the infrared blocking member may comprise a metal or a metal oxide.

In an exemplary embodiment, the metal or the metal oxide may have a diameter of 1 nm to 100 nm.

In an exemplary embodiment, the metal or the metal oxide may be nickel ((Ni), chromium (Cr), niobium (Nb), tantalum (Ta), iridium (Ir), vanadium (V), or an oxide of the same.

In an exemplary embodiment, the infrared blocking member may comprise at least any one of a diimmonium-based dye, a polymethine-based dye, an anthraquinone-based dye, phthalocyanine-based dye, a naphthalocyanine-based dye, and a thiol-nickel complex.

According to another embodiment of the present discloser, a display device comprise a display panel; a cover window disposed above the display panel; an adhesive member disposed under the display panel; an under-panel member disposed under the adhesive member and comprising an opening partially exposing a lower surface of the adhesive member; an optical sensor disposed under the display panel in the opening of the under-panel member; and an infrared blocking member disposed between the optical sensor and the cover window, wherein at least a part of the infrared blocking member overlaps the optical sensor from above the optical sensor.

In an exemplary embodiment, the infrared blocking member may comprise a material that blocks transmission of infrared light and prevent light whose center wavelength ranges from 780 nm to 2500 nm from entering the optical sensor.

In an exemplary embodiment, the infrared blocking member may be disposed between the cover window and the display panel.

In an exemplary embodiment, the infrared blocking member may be disposed in the opening and disposed on the optical sensor.

According to another embodiment, a method of fingerprint recognition includes transmitting light from a display panel toward a cover window of the display device; receiving reflected light at an optical sensor, wherein at least a portion of the display panel is located between the optical sensor and the cover window; blocking a portion of infrared light from reaching the optical sensor, wherein the infrared light comprises a portion of incident light on the cover window and a ratio of blocked infrared light to transmitted infrared light is higher than a ratio of blocked visible light to transmitted visible light of the incident light; and identifying a user fingerprint based at least in part on the reflected light.

BRIEF DESCRIPTION OF THE DRAWINGS

These and other aspects will become apparent and more readily appreciated from the following description of the embodiments, taken in conjunction with the accompanying drawings, in which.

DETAILED DESCRIPTION

Infrared light is a form of electromagnetic radiation with a longer wavelength than that of visible light. Fingerprint recognition devices often experience fingerprint recognition failures due to infrared light incident from outside sources.

Embodiments of the present disclosure provides for a display device that includes an infrared blocking member disposed on the optical sensor to prevent light from entering the optical sensor. Thus, some embodiment of the present disclosure may prevent failure of a fingerprint recognition function.

The present disclosure is described with reference to the accompanying drawings, in which embodiments of the present disclosure are shown. The invention may, however, be embodied in different forms and should not be construed as limited to the embodiments set forth herein. Rather, these embodiments are provided so that this disclosure will be thorough and complete, and will fully convey the scope of the present disclosure to those skilled in the art.

It will also be understood that when a layer is referred to as being "on" another layer or substrate, it can be directly on the other layer or substrate, or intervening layers may also be present. The same reference numbers indicate the same components throughout the specification.

Hereinafter, embodiments will be described with reference to the attached drawings.

Figure 1:
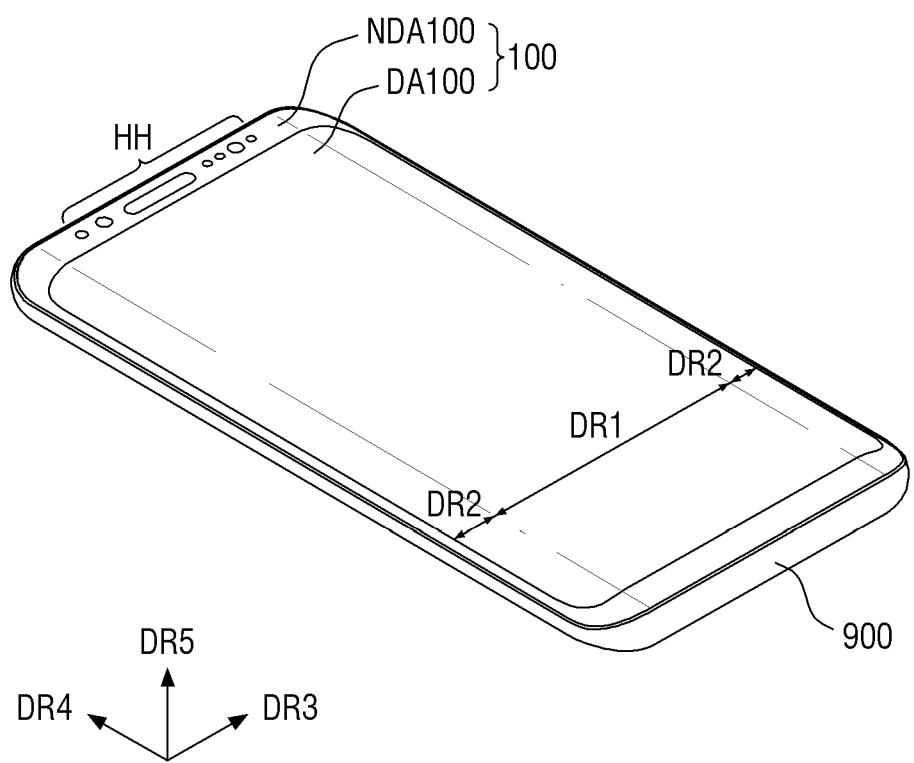
FIG. 1 is a perspective view of a display device according to an embodiment.

FIG. 1 is a perspective view of a display device 10 according to an embodiment.

Referring to FIG. 1, the display device 10 may be applicable to various electronic devices including small and medium-sized electronic devices such as tablet personal computers (PCs), smartphones, car navigation units, cameras, center information displays (CIDs) provided in cars, wrist watch-type electronic devices, personal digital assistants (PDAs), portable multimedia players (PMPs) and game machines and medium and large-sized electronic devices such as televisions, external billboards, monitors, PCs and notebook computers. However, these are just examples, and the display device 10 may also be applicable to other electronic devices without departing from the concept of the present disclosure.

The display device 10 may be rectangular in plan view. For example, the display device 10 may have a rectangular planar shape having relatively short sides in a first direction DR3 and relatively long sides in a second direction DR4 as illustrated in FIG. 1. Each corner may be rounded with a predetermined curvature or may be right-angled, where a short side extending in the first direction DR3 meets a long side extending in the second direction DR4.

The planar shape of the display device 10 is not limited to the rectangular shape, but pray also be another polygonal shape, a circular shape, or an elliptical shape.

The display device 10 may include a first area DR1 formed flat and a second area DR2 extending from right and left sides of the first area DR1. The second area DR2 may be formed as a flat shape or a curved shape. When the second area DR2 is formed as a flat shape, an angle formed by the first area DR1 and the second area DR2 may be an obtuse angle. When the second area DR2 is formed as a curved shape, second area DR2 may have a constant curvature or a varying curvature.

In FIG. 1, the second area DR2 extends from each of the right and left sides of the first area DR1. However, embodiments are not limited to this case. For example, the second area DR2 may also extend from one of the right and left sides of the first area DR1. Alternatively, the second area DR2 may extend from the right and left sides of the first area DR1 and also from at least any one of the upper and lower sides of the first area DR1. A case where the second area DR2 is disposed at the right and left edges of the display device 10 will be mainly described below.

Figure 2:
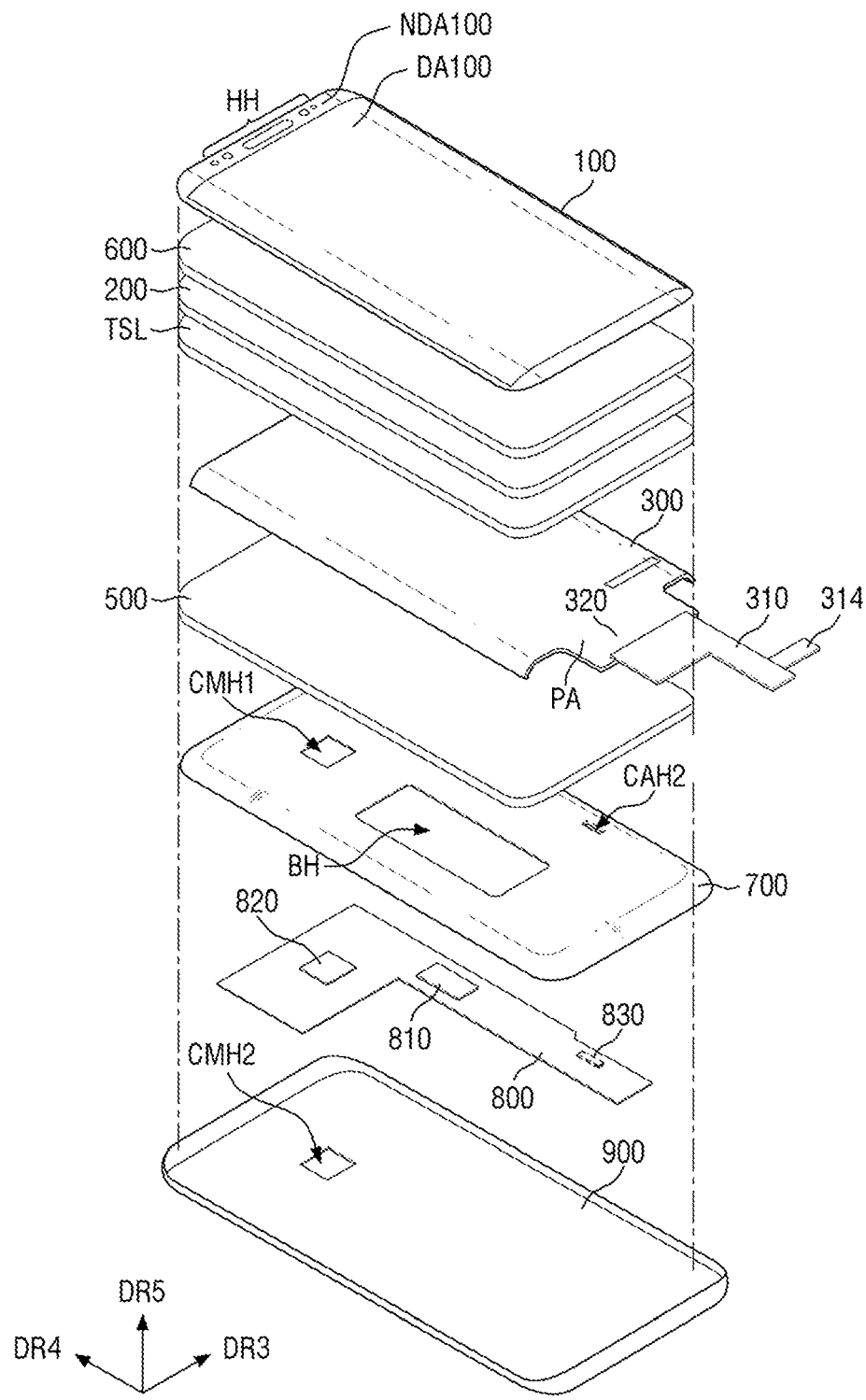
FIG. 2 is an exploded perspective view of the display device according to the embodiment.
Figure 3:
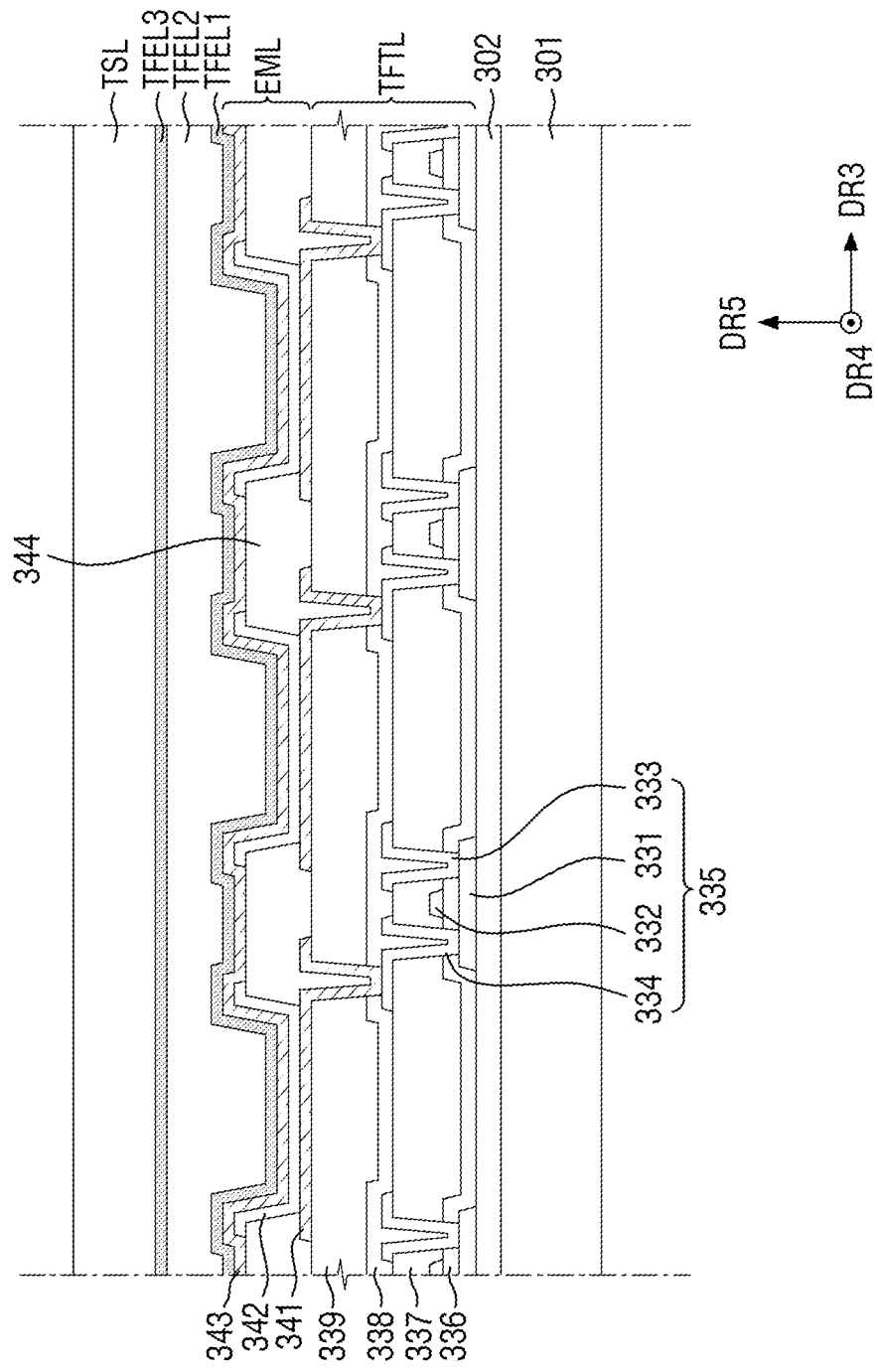
FIG. 3 is a cross-sectional view illustrating a display area of a display panel in detail.
Figure 4:
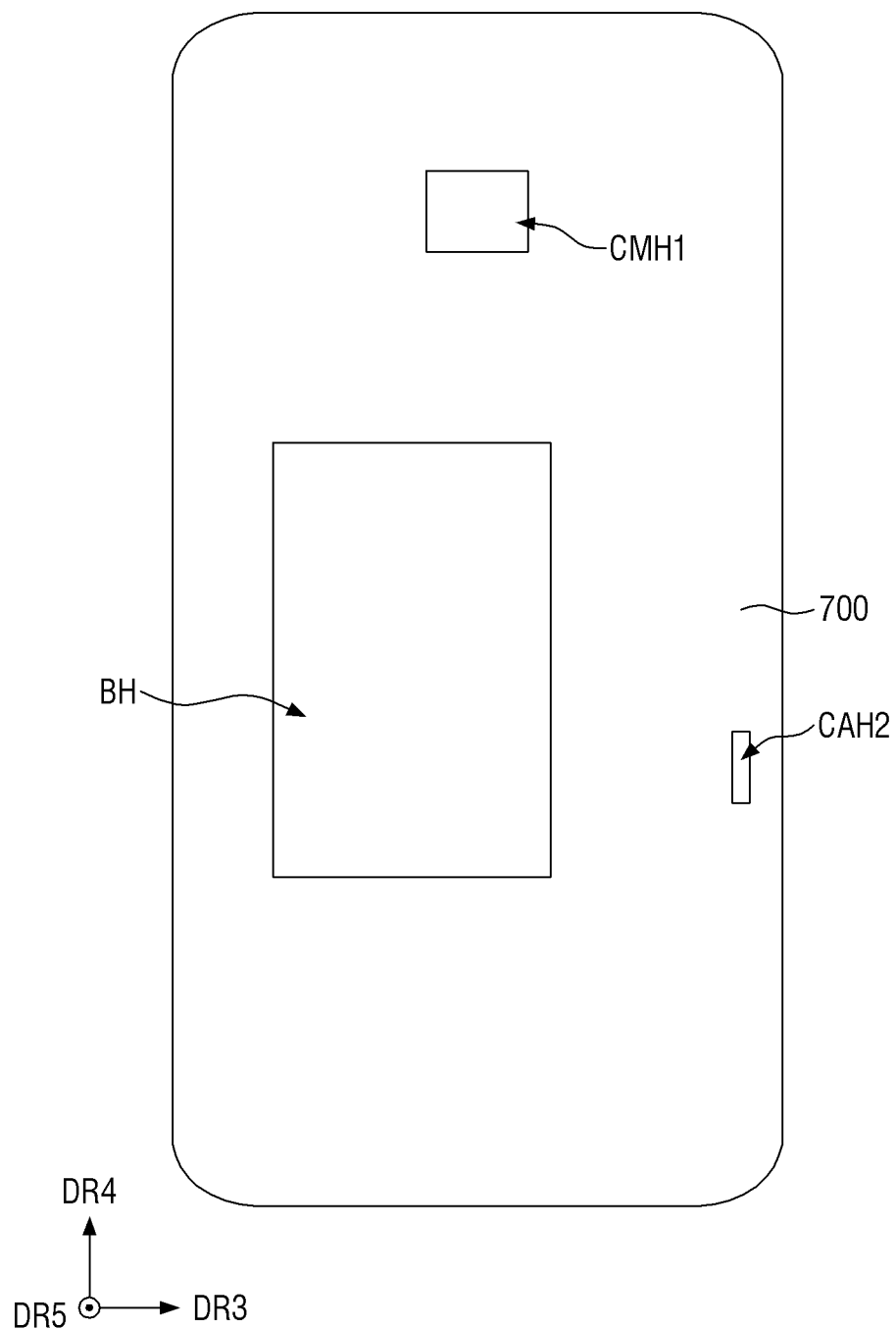
FIG. 4 is a plan view of an example of a middle frame of FIG. 2.
Figure 5:
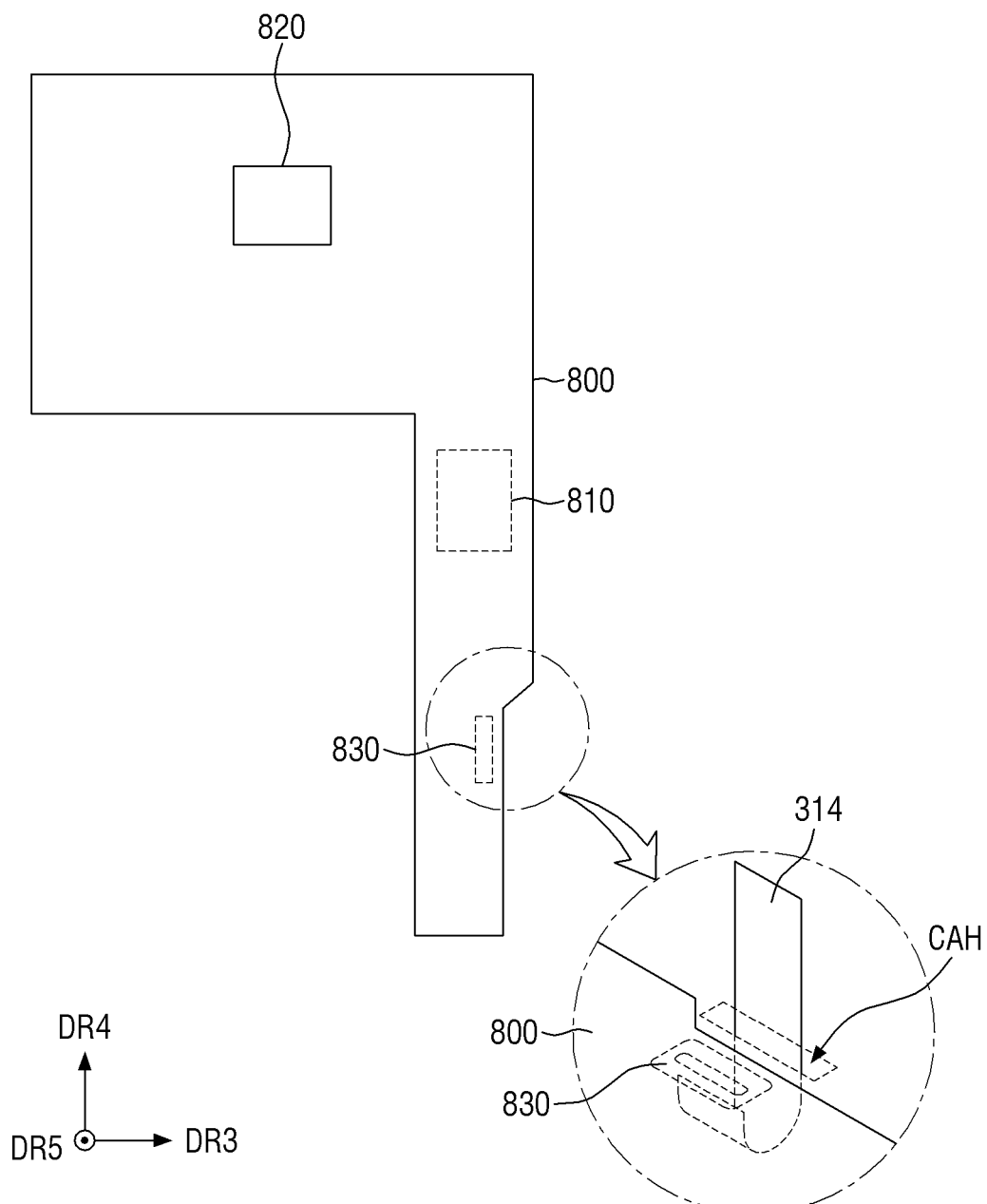
FIG. 5 is a plan view of a main circuit board of FIG. 2.

FIG. 2 is an exploded perspective view of the display device according to the embodiment. FIG. 3 is a cross-sectional view illustrating a display area of a display panel in detail. FIG. 4 is a plan view of an example of a middle frame of FIG. 2. FIG. 5 is a plan view of a main circuit board of FIG. 2.

Referring to FIGS. 2 through 5, the display device 10 according to the embodiment includes a cover window 100, an infrared blocking member 600, a polarizing film 200, the display panel 300, a display circuit board 310, an optical sensor 500, the middle frame 700, the main circuit board 800, and a bottom cover 900.

The cover window 100 may be disposed above the display panel 300 to cover an upper surface of the display panel 300. Thus, the cover window 100 may function to protect the upper surface of the display panel 300. The cover window 100 may be made of glass, sapphire, or plastic. The cover window 100 may be rigid or flexible.

The cover window 100 may be attached to the upper surface of the display panel 300 by an adhesive member. The adhesive member may be an optically cleared adhesive film (OCA) or an optically cleared resin (OCR).

A cover window protection layer may be disposed in front of the cover window 100. The cover window protection layer may perform at least one of a shatter prevention function, a shock absorption function, a dent prevention function, a fingerprint prevention function, and a glare prevention function for the cover window 100. The cover window protection layer may include a transparent polymer film. The transparent polymer film may include at least one of polyethylene terephthalate (PET), polyethylene naphthalate (PEN), polyether sulfone (PES), polyimide (PI), polyarylate (PAR), polycarbonate (PC), polymethyl methacrylate (PMMA), and cycloolefin copolymer (COC) resin.

The cover window 100 may include a light-transmitting portion DA 100 corresponding to the display panel 300 and a light-shielding portion NDA 100 corresponding to an area other than the display panel 300. The cover window 100 may be disposed in the first area DR1 and the second areas DR2. The light-transmitting portion DA 100 may be disposed in a part of the first area DR1 and a part of each of the second areas DR2. The light-shielding portion NDA 100 may be formed opaque. Alternatively, the light-shielding portion NDA 100 may be formed as a decorative layer having a pattern that may be shown to a user when an image is not displayed. For example, the light-shielding portion NDA 100 may be patterned with a company's logo or various characters. In addition, holes HH for exposing a front camera, an iris recognition sensor, an illuminance sensor, etc. may be formed in the light-shielding portion NDA 100. However, embodiments are not limited to this case. For example, some or all of the front camera, the iris recognition sensor, and the illuminance sensor may be embedded in the display panel 300. In this case, some or all of the holes HH may be removed.

The infrared blocking member 600 may be disposed between the cover window 100 and the optical sensor 500. Although the infrared blocking member 600 is disposed between the cover window 100 and the polarizing film 200 in FIG. 2, embodiments are not limited to this case. The infrared blocking member 600 may include a material that blocks the transmission of infrared light incident from the outside. However, the infrared blocking member 600 member may be otherwise transparent. For example, the blocking member 600 may allow the transmission of visible light.

The infrared blocking member 600 according to an embodiment may block infrared light incident from outside the display device 10, thereby preventing the infrared light from entering the optical sensor 500. The infrared blocking member 600 will be described in more detail later, together with the optical sensor 500 with reference to other drawings.

The polarizing film 200 is disposed between the display panel 300 and the cover window 100. The polarizing film 200 may function to prevent a decrease in visibility due to the reflection of external light. The polarizing film 200 may be composed of at least one layer. In an exemplary embodiment, the polarizing film 200 may include a polarizer 210 (see FIG. 9) and a hard coating layer 260 (see FIG. 9). The polarizer 210 may be a retardation film that includes at least one of a half-wave ($\lambda/2$) plate and a quarter-wave ($\lambda/4$) plate to retard the phase of light incident front the outside. The hard coating layer 260 of the polarizing film 200 may be disposed on the polarizer 210. The hard coating layer 260 may function to protect the polarizer 210. The hard coating layer 260 may be made of, but not limited to, cellulose resin, such as triacetyl cellulose, or polyester resin. The hard coating layer 260 of the polarizing film 200, according to an embodiment, may prevent infrared light from entering the optical sensor 500 by including a material that blocks transmission of infrared light. I some cases, the hard coating layer 260 of the polarizing film 200 may include or be integrated with the infrared blocking member 600. In some cases, the infrared blocking member 600 may be provided separately, or the polarizing film 200 may be omitted.

The display panel 300 and a touch member TSL may be disposed under the cover window 100. The display panel 300 may be overlapped by the light-transmitting portion 100DA of the cover window 100. The display panel 300 may be disposed in the first area DR1 and the second areas DR2. Therefore, an image of the display panel 300 can be seen in the first area DR1 and also in the second areas DR2.

The display panel 300 may be a light-emitting display panel including light-emitting elements. For example, the display panel 300 may be an organic light-emitting display panel using organic light-emitting diodes, a micro light-emitting diode display panel using micro light-emitting diodes, or a quantum dot light-emitting display panel including quantum dot light-emitting diodes. A case where the display panel 300 is an organic light-emitting display panel will be mainly described below.

Referring to FIG. 3, the display panel 300 may include a first substrate 301 and a pixel array layer. A pixel array layer may include a thin-film transistor layer TFTL, a light-emitting element layer EML, and a thin-film encapsulation layer TFEL. A thin-film transistor layer TFTL may be disposed on the first substrate 301. The touch member TSL may be disposed on the thin-film encapsulation layer TFEL. The display area DA (see FIG. 6) of the display panel 300 may be an area where the light-emitting element layer EML is formed to display an image, and a non-display area NDA (see FIG. 6) may be an area around the display area DA.

The first substrate 301 may be a rigid substrate or a flexible substrate that can be bent, folded, and rolled. The first substrate 301 may be made of an insulating material such as glass, quartz, or polymer resin. The polymer material may be, for example, polyethersulfone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), or a combination of the same. The first substrate 301 may also include a metal material.

The thin-film transistor layer TFTL is formed on the first substrate 301. The thin-film transistor layer TFTL includes thin-film transistors 335, a gate insulating layer 336, an interlayer insulating film 337, a protective layer 338, and a planarization layer 339.

A buffer layer 302 may be formed on the first substrate 301. The buffer layer 302 may be formed on the first substrate 301 to protect the thin-film transistors 335 and the light-emitting elements from moisture introduced through the first substrate 301, which is vulnerable to moisture penetration. The buffer layer 302 may be composed of a plurality of alternatly stacked inorganic layers. For example, the buffer layer 302 may be an alternatly stacked multilayer in which one or more inorganic layers are selected from a silicon oxide (SiOx) layer, a silicon nitride (SiNx) layer, and SiON layer. The buffer layer 302 can be omitted.

The thin-film transistors 335 are formed on the buffer layer 302. Each of the thin-film transistors 335 includes an active layer 331, a gate electrode 332, a source electrode 333, and a drain electrode 334. In FIG. 3, each of the thin-film transistors 335 is formed as a top-gate type in which the gate electrode 332 is located above the active layer 331. However, embodiments are not limited to this case. For example, each of the thin-film transistors 335 may also be formed as a bottom-gate type in which the gate electrode 332 is located under the active layer 331 or a double-gate type in which the gate electrode 332 is located both above and below the active layer 331.

The active layers 331 are formed on the buffer layer 302. The active layers 331 may be made of a silicon-based semiconductor material or an oxide-based semiconductor material. A light-shielding layer may be formed between the buffer layer 302 and the active layers 331 to block external light from entering the active layers 331.

The gate insulating layer 336 may be formed on the active layers 331. The gate insulating layer 336 may be an inorganic layer, for example, a SiOx layer, a SiNx layer, or a multilayer composed of these layers.

The gate electrodes 332 and gate lines may be formed on the gate insulating layer 336. Each of the gate electrodes 332 and the gate lines may be a single layer or a multilayer made of any one or more of molybdenum (Mo), aluminum (Al), chromium (Cr), gold (Au), titanium (Ti), nickel (Ni), neodymium (Ne), copper (Cu), and alloys of the same.

The interlayer insulating film 337 may be formed on the gate electrodes 332 and the gate lines. The interlayer insulating film 337 may be an inorganic layer, for example, a SiOx layer, a SiNx layer, or a multilayer composed of these layers.

The source electrodes 333, the drain electrodes 334, and data lines may be formed on the interlayer insulating film 337. Each of the source electrodes 333 and the drain electrodes 334 may be connected to an active layer 331 through a contact hole passing through the gate insulating layer 336 and the interlayer insulating film 337. Each of the source electrodes 333, the drain electrodes 334 and the data lines may be a single layer or a multilayer made of any one or more of molybdenum (Mo), aluminum (Al), chromium (Cr), gold (Au), titanium (Ti), nickel (Ni), neodymium (Ne), copper (Cu), and alloys of the same.

The protective layer 338 for insulating the thin-film transistors 335 may be formed on the source electrodes 333, the drain electrodes 334, and the data lines. The protective layer 338 may be an inorganic layer, for example, a SiOx layer, a SiNx layer, or a multilayer composed of these layers.

The planarization layer 339 may be formed on the protective layer 338 to planarize steps due to the thin-film transistors 335. The planarization layer 339 may be made of an organic layer such as acryl resin, epoxy resin, phenolic resin, polyamide resin, or polyimide resin.

The light-emitting element layer EML is formed on the thin-film transistor layer TFTL. The light-emitting element layer EML includes the light-emitting elements and a pixel defining layer 344.

The light-emitting elements and the pixel defining layer 344 are formed on the planarization layer 339. The light-emitting elements may be organic light-emitting devices, each including an anode 341, a light-emitting layer 342, and a cathode 343.

The anodes 341 may be formed on the planarization layer 339. The anodes 341 may be connected to the drain electrodes 334 of the thin-film transistors 335 through contact holes passing through the protective layer 338 and the planarization layer 339.

The pixel defining layer 344 may be formed on the planarization layer 339 and may cover edges of the anodes 341 to define pixels. For example, the pixel defining layer 344 serves as a pixel defining layer for defining the pixels. Each of the pixels emit light in an area in which the anode 341, the light-emitting layer 342, and the cathode 343 are sequentially stacked in the light-emitting layer 342, so that holes from the anode 341 and electrons from the cathode 343 are combined.

The light-emitting layers 342 are formed on the anodes 341 and the pixel defining layer 344. The light-emitting layers 342 may be organic light-emitting layers. Each of the light-emitting layers 342 may emit one of red light, green light, and blue light. Alternatively, the light-emitting layers 342 may be white light-emitting layers that emit white light. In this case, the light-emitting layers 342 may be a stack of a red light-emitting layer, a green light-emitting layer, and a blue light-emitting layer and may be a common layer common to a multitude of pixels. In this case, the display panel 300 may further include color filters for displaying red, green, and blue.

Each of the light-emitting layers 342 may include a hole transporting layer, a light-emitting layer, and an electron transporting layer. In addition, each of the light-emitting layers 342 may be formed in a tandem structure of two or more stacks, in which case a charge generating layer may be formed between the stacks.

The cathode 343 is formed on the light-emitting layers 342. The cathode 343 may be formed to cover the light-emitting layers 342. The cathode 343 may be a common layer common to a multitude of pixels.

The anodes 341 may be made of a metal material having high reflectivity when the light-emitting element layer EMI, is formed as a top emission type which emits light in an upward direction. Examples of metal materials having high reflectivity are a stacked structure (Ti/Al/Ti) of aluminum and titanium, a stacked structure (ITO/Al/ITO) of aluminum and indium tin oxide, an APC alloy, or a stacked structure (ITO/APC/ITO) of an APC alloy and indium tin oxide. The APC alloy is an alloy of silver (Ag), palladium (Pd), and copper (Cu). In addition, the cathode 343 may be made of a transparent conductive material (TCO) capable of transmitting light, such as indium tin oxide (ITO) or indium zinc oxide (IZO), or a semi-transmissive conductive material such as magnesium (Mg), silver (Ag) or an alloy of Mg and Ag. When the cathode 343 is made of a semi-transmissive conductive material, the light output efficiency may be increased by a microcavity.

The anodes 341 may be made of a metal material having high reflectivity when the light-emitting element layer EML is formed as a top emission type which emits light in an upward direction. A metal material having high reflectivity can be a stacked structure (Ti/Al/Ti) of aluminum and titanium, a stacked structure (ITO/Al/ITO) of aluminum and indium tin oxide, art APC alloy, or a stacked structure (ITO/APC/ITO) of an APC alloy and indium tin oxide. When the anodes 341 are made of a semi-transmissive conductive material, the light output efficiency may be increased by a microcavity.

The thin-film encapsulation layer TFEL is formed on the light-emitting element layer EML. The thin-film encapsulation layer TFEL serves to prevent oxygen or moisture from permeating into the light-emitting layers 342 and the cathode 343. To this end, the thin-film encapsulation layer TFEL may include at least one inorganic layer. The inorganic layer may be made of silicon nitride, aluminum nitride, zirconium nitride, titanium nitride, hafnium nitride, tantalum nitride, silicon oxide, aluminum oxide, or titanium oxide. In addition, the thin-film encapsulation layer TFEL may further include at least one organic layer. The organic layer may be formed to a sufficient thickness to prevent particles from penetrating the thin-film encapsulation layer TFEL and entering the light-emitting layers 342 and the cathode 343. The organic layer may include any one of epoxy, acrylate, and urethane acrylate. The thin-film encapsulation layer TEEL may have, but not limited to, a water vapor transmission rate (WVTR) of $1\times10^{-6}$ g/day or less.

The thin-film encapsulation layer TFEL may be disposed entirely regardless of the pixels of the light-emitting element layer EML. The thin-film encapsulation layer TFEL may cover the light-emitting element layer EML including the cathode 343 disposed under the thin-film encapsulation layer TFEL. Thus, the light-emitting element layer EML may be surrounded and sealed by the thin-film encapsulation layer TFEL. In addition, although not illustrated in the drawings, if a capping layer is further disposed between the thin-film encapsulation layer TFEL and the cathode 343 to cover the cathode 343, the thin-film encapsulation layer TFEL may directly cover the capping layer.

According to an embodiment, the thin-film encapsulation layer TFEL may include a first encapsulating inorganic layer TFEL1, an encapsulating organic layer TFEL2, and a second encapsulating inorganic layer TFEL3 sequentially stacked on the cathode 343.

The first encapsulating inorganic layer TFEL1 may be disposed on a surface of the cathode 343. The cathode 343 may include irregularities in its surface by conformally reflecting steps disposed under the cathode 343. The first encapsulating inorganic layer TFEL1 may be made of inorganic material to conformally reflect at least some of the irregularities of the cathode 343 disposed under the first encapsulating inorganic layer TFELL Therefore, the first encapsulating inorganic layer TFEL1 may also include irregularities in its surface, like the cathode 343. The first encapsulating inorganic layer TFEL1 may cover the cathode 343 to protect the cathode 343.

The second encapsulating inorganic layer TFEL3 may be disposed on a surface of the encapsulating organic layer TFEL2.

The first encapsulating inorganic layer TFEL1 and the second encapsulating inorganic layer TFEL3 may directly contact each other at their edge portions. For example, the first encapsulating inorganic layer TFEL1 and the second encapsulating inorganic layer TFEL3 may contact each other at their ends when the first encapsulating inorganic layer TFEL1 and the second encapsulating inorganic layer TFEL3 are larger than the encapsulating organic layer TFEL2 in plan view. Accordingly, the encapsulating organic layer TFEL2 may be sealed by the first encapsulating inorganic layer TFEL1 and the second encapsulating inorganic layer TFEL3. Although not illustrated in the drawings, the second encapsulating inorganic layer TFEL3 may protrude further outward than the first encapsulating inorganic layer TFEL1. In some cases, the first encapsulating inorganic layer TFEL1 may protrude further outward than the second encapsulating inorganic layer TFEL3. Additionally, the first encapsulating inorganic layer TFEL1 and the second encapsulating layer TFEL3 may have the same planar size so that their ends are aligned with each other.

Each of the first encapsulating inorganic layer TFEL1 and the second encapsulating inorganic layer TFEL3 may be made of silicon nitride, aluminum nitride, zirconium nitride, titanium nitride, hafnium nitride, tantalum nitride, silicon oxide, aluminum oxide, titanium oxide, tin oxide, cerium oxide, silicon oxynitride (SiON), or lithium fluoride. The encapsulating organic layer TFEL2 may be disposed between the first encapsulating inorganic layer TFEL1 and the second encapsulating inorganic layer TFEL3. The encapsulating organic layer TFEL2 may fill the surface irregularities of the first encapsulating inorganic layer TFEL1 to reduce or planarize the underlying steps.

The encapsulating organic layer TFEL2 may cover the first encapsulating inorganic layer TFEL1 and may be thicker than the first encapsulating inorganic layer TFEL1. The encapsulating organic layer TFEL2, including an organic material, may cover the first encapsulating inorganic layer TFEL1 having steps or irregularities and may have a substantially flat upper surface. For example, the encapsulating organic layer TFEL2 may compensate for the steps of the first encapsulating inorganic layer TFEL1.

The encapsulating organic layer TFEL2 may be made of, but not limited to, acrylic resin, methacrylic resin, polyisoprene, vinyl resin, epoxy resin, urethane resin, cellulose resin, or perylene resin. In addition, in an exemplary embodiment, the encapsulating organic layer TFEL2 may include a material that blocks infrared light so as to prevent infrared light from entering the optical sensor 500. For example, when the thin-film encapsulation layer TFEL of the display panel 300 includes an infrared blocking material, the infrared blocking member 600 may be omitted. Since the thin-film encapsulation layer TFEL has an infrared blocking function, the infrared blocking member 600 may be integrated into the display panel 300 and disposed under the touch member TSL. This will be described in detail later with reference to other drawings.

The touch member TSL is disposed on the thin-film encapsulation layer TFEL. The touch member TSL may include touch electrodes for sensing a user's touch using a capacitance method and touch lines for connecting pads and the touch electrodes. For example, the touch member TSL may sense a user's touch using a self-capacitance method or a mutual capacitance method. Although not illustrated, a touch circuit board may be attached to a side of the touch member TSL. A touch board may include a touch driver electrically connected to touch driving electrodes and touch sensing electrodes of the touch member TSL. The touch circuit board may be a flexible printed circuit board. The touch driver may be formed as an integrated circuit.

Although the touch member TSL is illustrated as a separate member from the display panel 300 in FIG. 2, embodiments are not limited to this case. The touch member TSL may also be embedded in the display panel 300 by being disposed on the thin-film encapsulation layer TFEL of the display panel 300 as illustrated in FIG. 3. In this case, the touch driving electrodes and touch sensing electrodes of the touch member TSL may be formed on the thin-film encapsulation layer TFEL of the display panel 300. A thickness of the display device 10 can be reduced when the touch member TSL is disposed directly on the thin-film encapsulation layer TFEL. The thickness reduction of display device 10 is compared with when a separate touch panel, including the touch member TSL, is attached to the thin-film encapsulation layer TFEL. Although the touch member TSL is illustrated as being embedded in the display panel 300 to form one member in the following drawings, embodiments are not limited to this case.

The display circuit board 310 and a display driver unit 320 may be attached to a protruding area PA provided on a side of the display panel 300. An end of the display circuit board 310 may be attached to pads provided in the protruding area PA of the display panel 300 by using an anisotropic conductive film. The protruding area PA of the display panel 300 and the display circuit board 310 may be bent toward a lower surface of the display panel 300.

The display driver unit 320 receives control signals and power supply voltages through the display circuit board 310 and generates and outputs signals and voltages for driving the display panel 300. The display driver unit 320 may be formed as an integrated circuit and attached to the protruding area PA of the display panel 300 using a chip-on glass (COG) method, a chip-on plastic (COP) method, or an ultrasonic method. However, embodiments are not limited to this case. For example, the display driver unit 320 may be attached to the display circuit board 310.

An end of a cable 314 may be connected to a main connector 830 of the main circuit board 800 disposed under the middle frame 700 through a cable hole CAH2 penetrating the middle frame 700, as illustrated in FIGS. 4 and 5.

Although not illustrated in the drawings, a touch driver unit (not illustrated) may be disposed on the display circuit board 310. The touch driver unit may be formed as an integrated circuit and attached to an upper surface of the display circuit board 310. The touch driver unit may be connected to the touch electrodes and the touch lines of the touch member TSL of the display panel 300 through the display circuit board 310. In the mutual capacitance method, the touch driver unit may transmit touch driving signals to driving electrodes among the touch electrodes and sense a touch by detecting charge change amounts of capacitances between the driving electrodes and sensing electrodes among the touch electrodes through the sensing electrodes.

The optical sensor 500 may be disposed under the display panel 300. According to an embodiment, the optical sensor 500 may be disposed under the whole of the display panel 300. In this case, the optical sensor 500 may sense a predetermined input in the display area DA (see FIG. 6) of the display panel 300 of the display device 10. According to an embodiment, the optical sensor 500 may be an optical fingerprint recognition sensor that can recognize a user's fingerprint using an optical method. As will be described later, when the optical sensor 500 is an optical fingerprint recognition sensor and the display area DA may be a fingerprint recognition area FA (see FIG. 6). The optical sensor 500 may receive light emitted from the display panel 300 and reflected by a user's fingerprint and recognize the user's fingerprint based on the received light. The optical sensor 500, which may be an optical fingerprint recognition sensor, will be described in detail later together with the infrared blocking member 600 with reference to other drawings.

Although not illustrated in the drawings, an under-panel member 400 (see FIG. 7) may be disposed under the optical sensor 500. The under-panel member 400 may be attached to a lower surface of the optical sensor 500 by an adhesive member AM (see FIG. 8). The adhesive member AM may be an OCA, an OCR, or a pressure-sensitive adhesive (PSA). However, embodiments are not limited to this case. In some cases, the under-panel member 400 may be disposed directly on the lower surface of the display panel 300 and include an opening that partially exposes the lower surface of the display panel 300. The optical sensor 500 may be disposed in the opening.

The middle frame 700 may be disposed under the under-panel member 400. The middle frame 700 may include plastic, metal, or both plastic and metal.

A first camera hole CMH1, a battery hole BH, and the cable hole CAH may be formed in the middle frame 700. A camera device 820 is inserted into a first camera hole CMH1 and a battery is disposed into a battery hole BH. Additionally, the cable 314 connected to the display circuit board 310 passes through the cable hole CAH.

The main circuit board 800 may be disposed under the middle frame 700. The main circuit board 800 may be a printed circuit board or a flexible printed circuit board.

The main circuit board 800 may include a main processor 810, the camera device 820, and the main connector 830. The camera device 820 may be disposed on both upper and lower surfaces of the main circuit board 800 and the main processor 810 may be disposed on the upper surface of the main circuit board 800. Additionally, the main connector 830 may be disposed on the lower surface of the main circuit board 800.

The main processor 810 may control a multitude of functions of the display device 10, For example, the main processor 810 may output digital video data to the display driver unit 320 through the display circuit board 310 so that the display panel 300 can display an image. In addition, the main processor 810 may receive touch data from the touch driver unit, determine a user's touch position, and then execute an application indicated by an icon displayed at the user's touch position.

The main processor 810 may be an application processor, central processing unit, or system chip formed as an integrated circuit.

The camera device 820 processes an image frame such as a still image or a moving image obtained by an image sensor in a camera mode and outputs the processed image frame to the main processor 810.

The cable 314 passing through the cable hole CAH of the middle frame 700 may be connected to the main connector 830. Therefore, the main circuit board 800 may be electrically connected to the display circuit board 310.

In addition, the main circuit board 800 may further include a mobile communication module capable of transmitting or receiving a wireless signal to or from at least one of a base station, an external terminal, and a server over a mobile communication network. The wireless signal may include a voice signal, a video call signal, or various types of data according to transmission/reception of text/multimedia messages.

The bottom cover 900 may be disposed under the middle frame 700 and the main circuit board 800. The bottom cover 900 may be fastened and fixed to the middle frame 700. The bottom cover 900 may form the lower exterior of the display device 10. The bottom cover 900 may include plastic and/or metal.

A second camera hole CMH2 into which the camera device 820 is inserted to protrude outward may be formed in the bottom cover 900. The position of the camera device 820 and the positions of the first and second camera holes CMH1 and CMH2 corresponding to the camera device 820 are not limited to the embodiment illustrated in FIG. 2.

Figure 6:
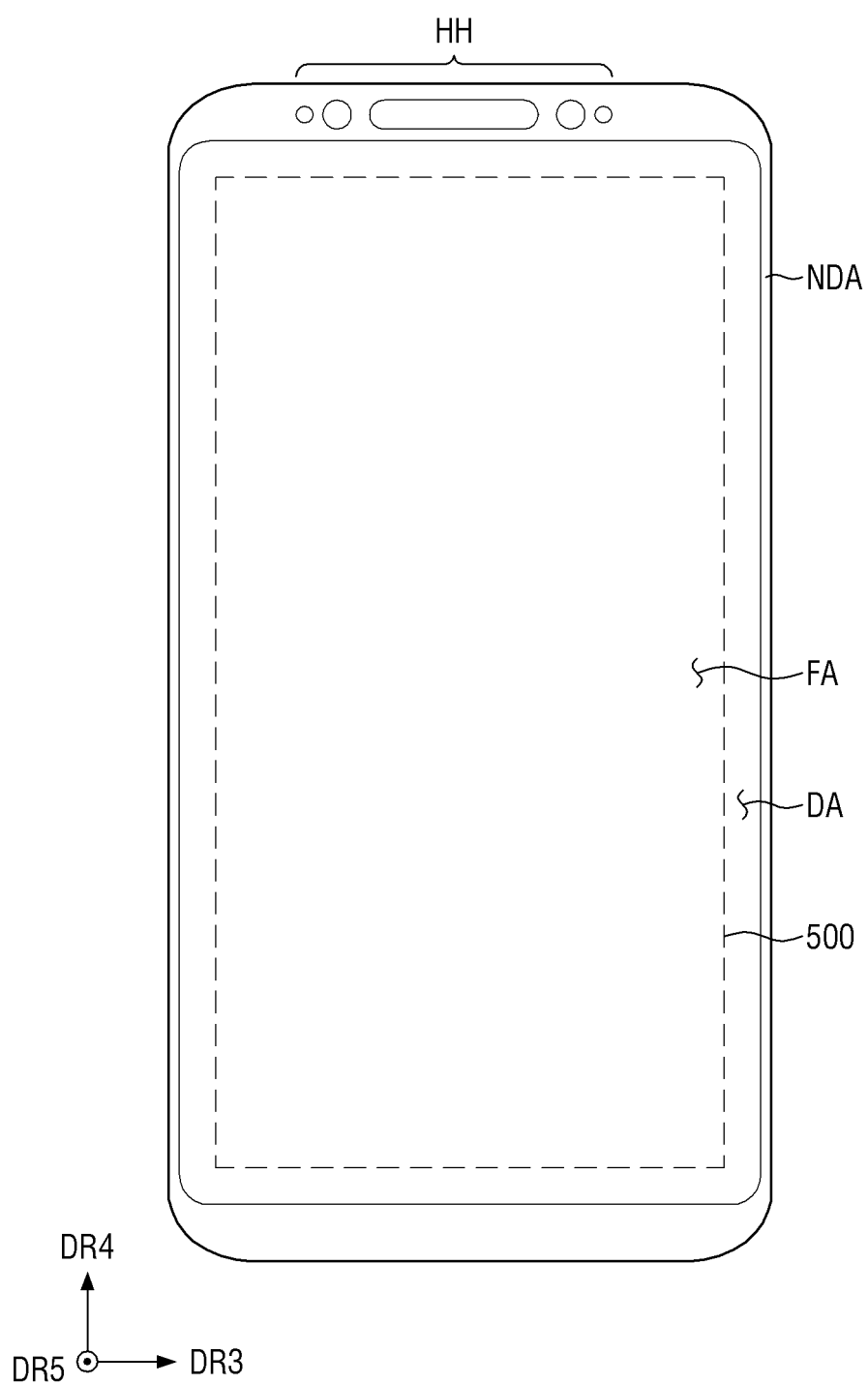
FIG. 6 is a plan view schematically illustrating a fingerprint recognition area of the display device according to the embodiment.

FIG. 6 is a plan view schematically illustrating the fingerprint recognition area FA of the display device 10 according to the embodiment.

Referring to FIG. 6, the display device 10 may include the display area DA which corresponds to the light-transmitting portion DA 100 of the cover window 100 of FIG. 1. An image of the display panel 300 is displayed and the non-display area NDA which corresponds to the light-shielding portion NDA 100 of the cover window 100 and in which an image of the display panel 300 is not displayed. The display panel 300 may be overlapped by each of the light-transmitting portion DA 100 and the light-shielding portion NDA100 of the cover window 100. The display area DA and the non-display area NDA may also be defined in the display panel 300.

According to the embodiment, since the display device 10 includes the optical sensor 500, the display device 10 may include the fingerprint recognition area FA in the display area DA. The optical sensor 500 is an optical fingerprint recognition sensor. The fingerprint recognition area FA may be an area overlapping the optical sensor 500 disposed under the display panel 300 so that a user's fingerprint can be recognized. The fingerprint recognition area FA may be formed in the substantially whole display area DA as the optical sensor 500 may be disposed under the whole display panel 300. Accordingly, the display device 10 can recognize a user's fingerprint regardless of position.

Infrared light IR incident from the outside may hinder the optical sensor 500 from recognizing a user's fingerprint when the optical sensor 500 is an optical fingerprint recognition sensor that recognizes a user's fingerprint using an optical method. The infrared light IR incident from the outside may increase the false recognition rate and non-recognition rate of the optical sensor 500. However, the display device 10, according to the embodiment, includes the infrared blocking member 600 disposed on the optical sensor 500 to prevent infrared light from entering the optical sensor 500.

Figure 7:
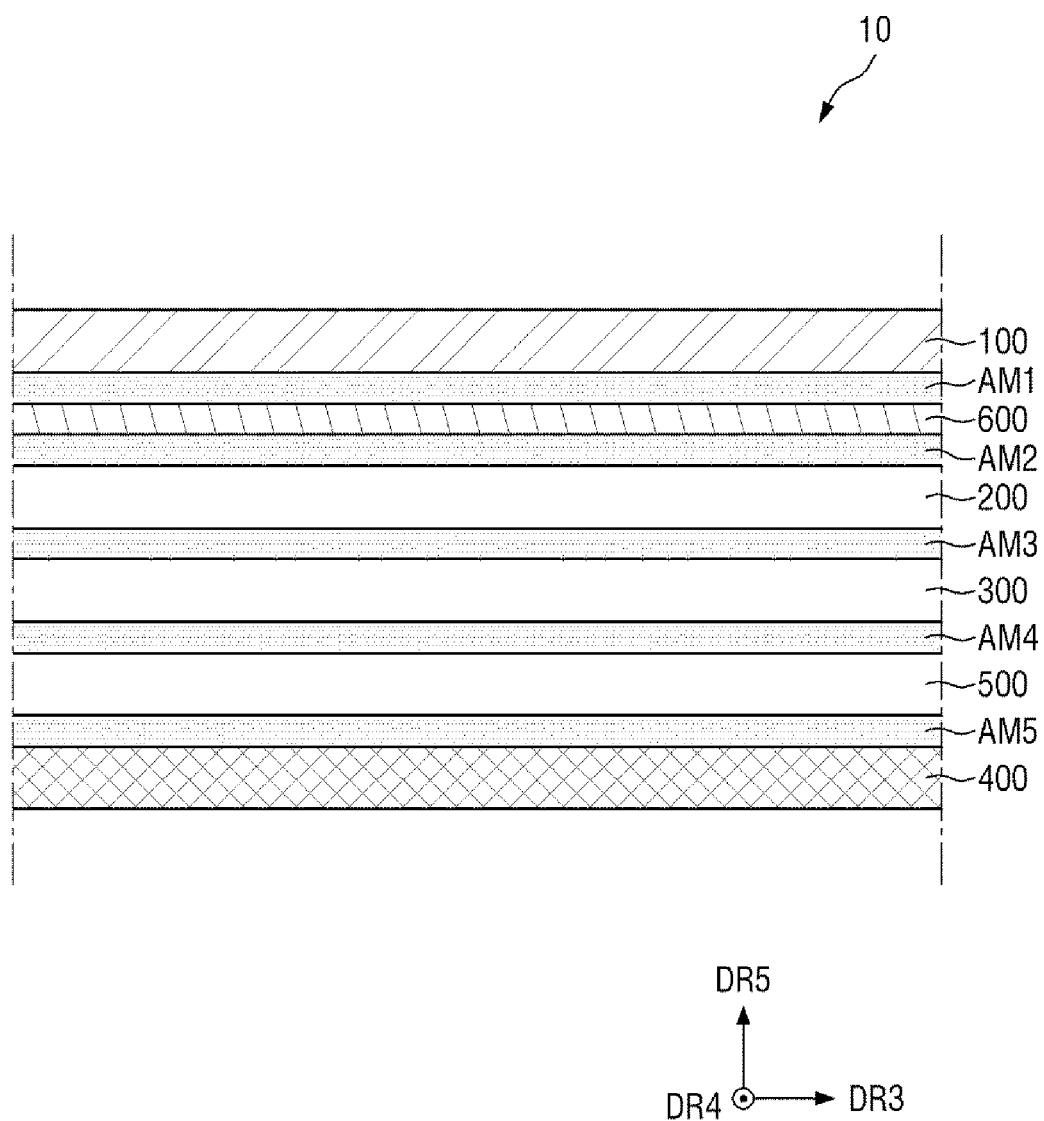
FIG. 7 is a schematic cross-sectional view of the display levice according to the embodiment.
Figure 8:
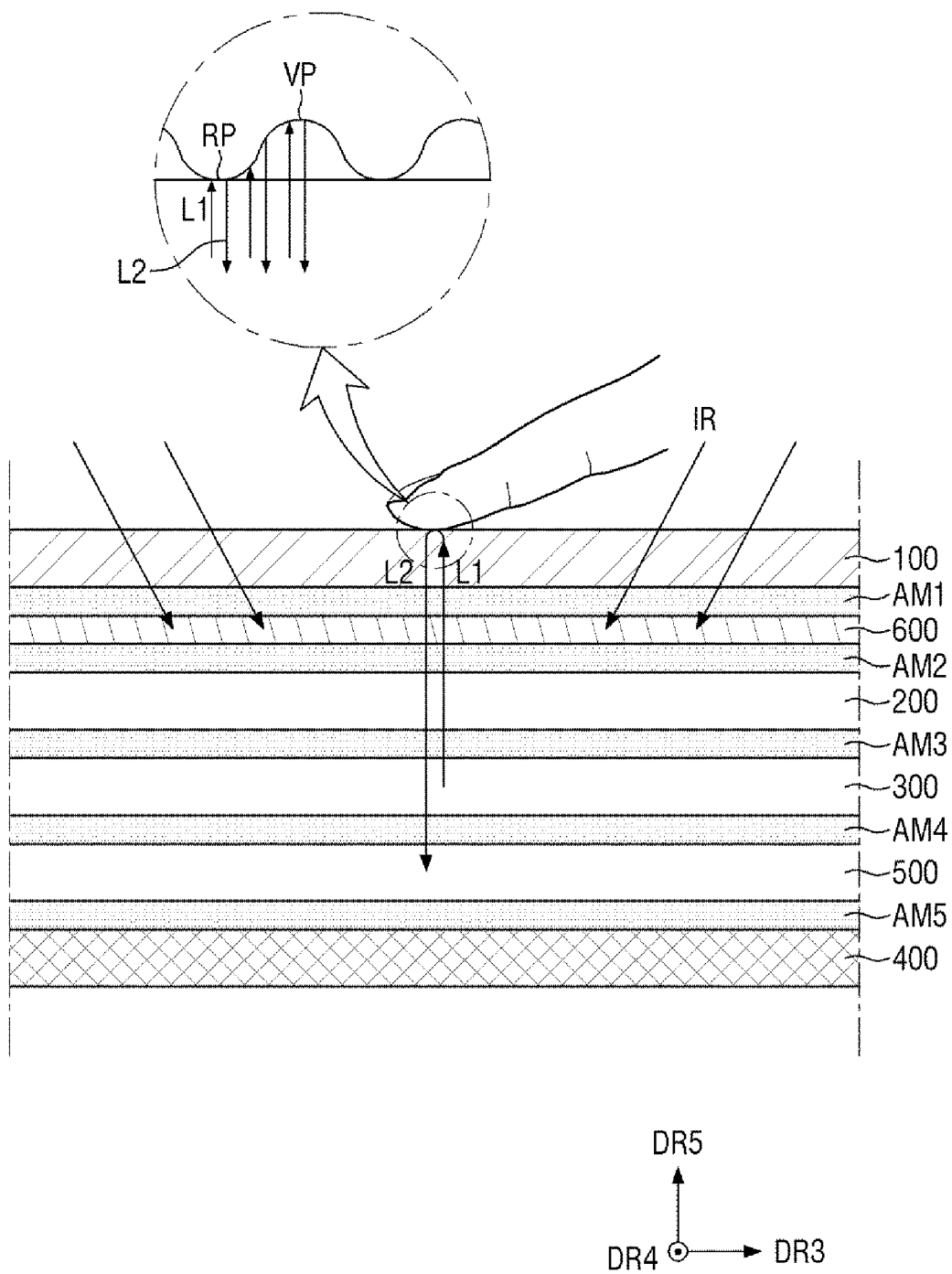
FIG. 8 is a schematic view illustrating a fingerprint recognition method of an optical sensor according to an embodiment.

FIG. 7 is a schematic cross-sectional view of the display device 10 according to the embodiment. FIG. 8 is a schematic view illustrating a fingerprint recognition method of the optical sensor 500 according to an embodiment.

Referring to FIGS. 7 and 8, the display device 10 according to the embodiment may include the display panel 300, the cover window 100 disposed on the display panel 300, the optical sensor 500 disposed under the display panel 300, and the infrared blocking member 600 disposed between the optical sensor 500 and the cover window 100. The display device 10 may further include the polarizing film 200, the under-panel member 400, etc. in addition to the above members.

The under-panel member 400 may be disposed under the optical sensor 500 to prevent a reduction in the recognition rate of the optical sensor 500. The under-panel member 400 may include a buffer member for absorbing external shock, a film layer, a shielding member for shielding electromagnetic waves, and a heat-dissipating member for dissipating the heat of the display panel 300. However, embodiments are not limited to this case, and the under-panel member 400 may further include a light-shielding layer for shielding light incident from the outside and a light-absorbing member. The light-absorbing member may be disposed under the display panel 300. The light-absorbing member may block transmission of light to prevent elements disposed under the light-absorbing member from being seen from above the display panel 300. For example, the light-absorbing member may include a light-absorbing material such as a black pigment or dye.

The buffer member may be disposed under a fifth adhesive member AM5 or the light-absorbing member. The buffer member absorbs external shock to prevent the display panel 300 from being damaged. The buffer member may be composed of a single layer or a plurality of layers. For example, the buffer member may be made of polymer resin such as polyurethane, polycarbonate, polypropylene or polyethylene or may be made of an elastic material such as sponge formed by foaming rubber, a urethane-based material or an acrylic-based material. The buffer member may be a cushion layer.

The film layer may be disposed under the buffer member. The film layer may be made of a flexible thin film. For example, the film layer may include polyallylate, polyimide (PI), polycarbonate (PC), cellulose triacetate (CAT), cellulose acetate propionate (CAP), or a combination of the same.

The shielding member may be disposed under the film layer. The shielding member may be made of graphite or carbon nanotubes to shield electromagnetic waves.

The heat-dissipating member may be disposed under the shielding member. The heat-dissipating member may be made of a thin metal film having excellent thermal conductivity, such as copper. However, embodiments are not limited to this case, and the heat-dissipating member may also be made of metal having conductivity.

Referring to FIGS. 7 and 8, the cover window 100, the infrared blocking member 600, the polarizing film 200, the display panel 300, the optical sensor 500 and the under-panel member 400 may be bonded to each other by adhesive members AM. A first adhesive member AMI may bond the cover window 100 and the infrared blocking member 600 together, a second adhesive member AM2 may bond the infrared blocking member 600 and the polarizing film 200 together, a third adhesive member AM3 may bond the polarizing film 200 and the display panel 300 together, a fourth adhesive member AM4 may bond the display panel 300 and the optical sensor 500 together, and the fifth adhesive member AM5 may bond the optical sensor 500 and the under-panel member 400 together. The adhesive members AM may be optically clear. For example, each of the adhesive members AM may be an OCA, an OCR, or a PSA.

Although the first through fifth adhesive members AM1 through AM5 bonding, the members to each other are illustrated in FIGS. 7 and 8, some of them can be omitted. Some of the first adhesive members AM1 through fifth adhesive members AM5 may be omitted or may be integrated with the infrared blocking member 600 when the infrared blocking member 600 is integrated or embedded into other members.

The optical sensor 500 may be disposed between the display panel 300 and the under-panel member 400. Light L1 emitted upward from the display panel 300 toward the cover window 100 may be reflected by a user's fingerprint regions RP and VP toward the display panel 300 (L2 in FIG. 8). The light L2 reflected by the user's fingerprint regions RP and VP may pass through the display panel 300 and enter the optical sensor 500 disposed under the display panel 300. The optical sensor 500 may receive the light L2 emitted from the display panel 300, then recognize the user's fingerprint based on the received light L2. The user's fingerprint regions RB and BP are reflected by received light L2. The optical sensor 500 may recognize the user's fingerprint shape by receiving different position information of the light L2 reflected by a valley regions VP, ridge regions RP, and regions between the valley regions VP and the ridge regions RP of the user. The optical sensor 500 may also include a photographing device to recognize a user's fingerprint shape by photographing the user's fingerprint shape.

The infrared blocking member 600 may be disposed above the optical sensor 500 to block transmission of infrared light IR incident from the outside through the cover window 100. For example, light whose center wavelength ranges from about 780 nm to 2500 nm may be blocked. Other wavelengths may be transmitted through the infrared blocking member 600.

The infrared blocking member 600 may be disposed in an area overlapping at least the optical sensor 500 in a third direction DR5, for example, in a thickness direction. The infrared light IR incident from the outside may hinder the optical sensor 500 from recognizing a user's fingerprint. In some cases, the display device 10 may include more than one infrared blocking member 600 that blocks transmission of infrared light. As illustrated in FIG. 8, the display device 10 may include an infrared blocking member 600 to prevent the infrared light IR incident from the outside from entering the optical sensor 500, thereby reducing the non-recognition rate and false recognition rate of the optical sensor 500.

In an exemplary embodiment, the material that blocks transmission of infrared light may include a metal or an oxide of the same. For example, the material that blocks transmission of infrared light may include nickel (Ni), chromium (Cr), niobium (Nb), tantalum (Ta), iridium (Ir), vanadium (V), or an oxide of the same. The infrared blocking member 600 may include the above-mentioned metal or the oxide of the same to block transmission of infrared light. The metal or the oxide of the same may have a diameter of 1 nm to 100 nm and reflect the incident infrared light IR. However, embodiments are not limited to this case.

In addition, the material that blocks transmission of infrared light may include a dye such as a diimmonium-based dye, a polymethine-based dye, an anthraquinone-based dye, a phthalocyanine-based dye, a naphthalocyanine-based dye, or a thiol-nickel complex. If included, the dye may block transmission of the incident infrared light IR by absorbing the infrared light IR. However, embodiments are not limited to this case, and the infrared blocking member 600 may also include a mixture of the above-mentioned metal. Additionally, the infrared blocking member 600 may also include the oxide of the same and the dye as the material that blocks transmission of infrared light.

In an embodiment, the infrared blocking material included in the infrared blocking member 600 may be dispersed in a resin. For example, the resin may include one or more of ethyl acrylate, butyl acrylate, ethyihexyl acrylate, vinyl acetate, acrylonitrile, acrylamide, styrene, methyl methacrylate, and methacrylate. The resin may further include a binder in the above-mentioned types of resin. For example, the binder may include at least any one of functional monomers such as methacrylic acid, acrylic acid, itaconic acid, hydroxyethyl methacrylate, hydroxypropyl methacrylate, dimethylaminoethyl, acrylamide, methylol acrylamide, glycidyl methacrylamide and maleic acid and crosslinkers such as melamine, urea, polyisocyanate, epoxy, metal chelate, and polyamine.

The display device 10, according to the embodiment, may include the infrared blocking member 600 to block the incident infrared light. IR from entering the optical sensor 500. Accordingly, the optical sensor 500 can have a high recognition rate if the optical sensor 500 is disposed under the whole display panel 300, so that the fingerprint recognition area FA is formed over the whole display area DA.

The display device 10 may not necessarily include a separate infrared blocking member 600 but may include the infrared blocking member 600 integrated with the adhesive member AM, the polarizing film 200, the display panel 300, etc. Since the infrared blocking member 600 may includes infrared blocking material dispersed in the resin as described above, the infrared blocking member 600 can be integrated with other members by adding the infrared blocking material to other members of the display device 10. Various components of the display device 10 may perform the infrared blocking function.

Thus, according to another embodiments of the present disclosure, a method of fingerprint recognition includes transmitting light L1 from a display panel 300 toward a cover window 100 of the display device; receiving reflected light L2 at an optical sensor 500, wherein at least a portion of the display panel 300 is located between the optical sensor 500 and the cover window 100; blocking a portion of infrared light IR from reaching the optical sensor 500, wherein the infrared light IR comprises a portion of incident light on the cover window 100 and a ratio of blocked infrared light to transmitted infrared light is higher than a ratio of blocked visible light to transmitted visible light of the incident light; and identifying a user fingerprint based at least in part on the reflected light L2.

Figure 9:
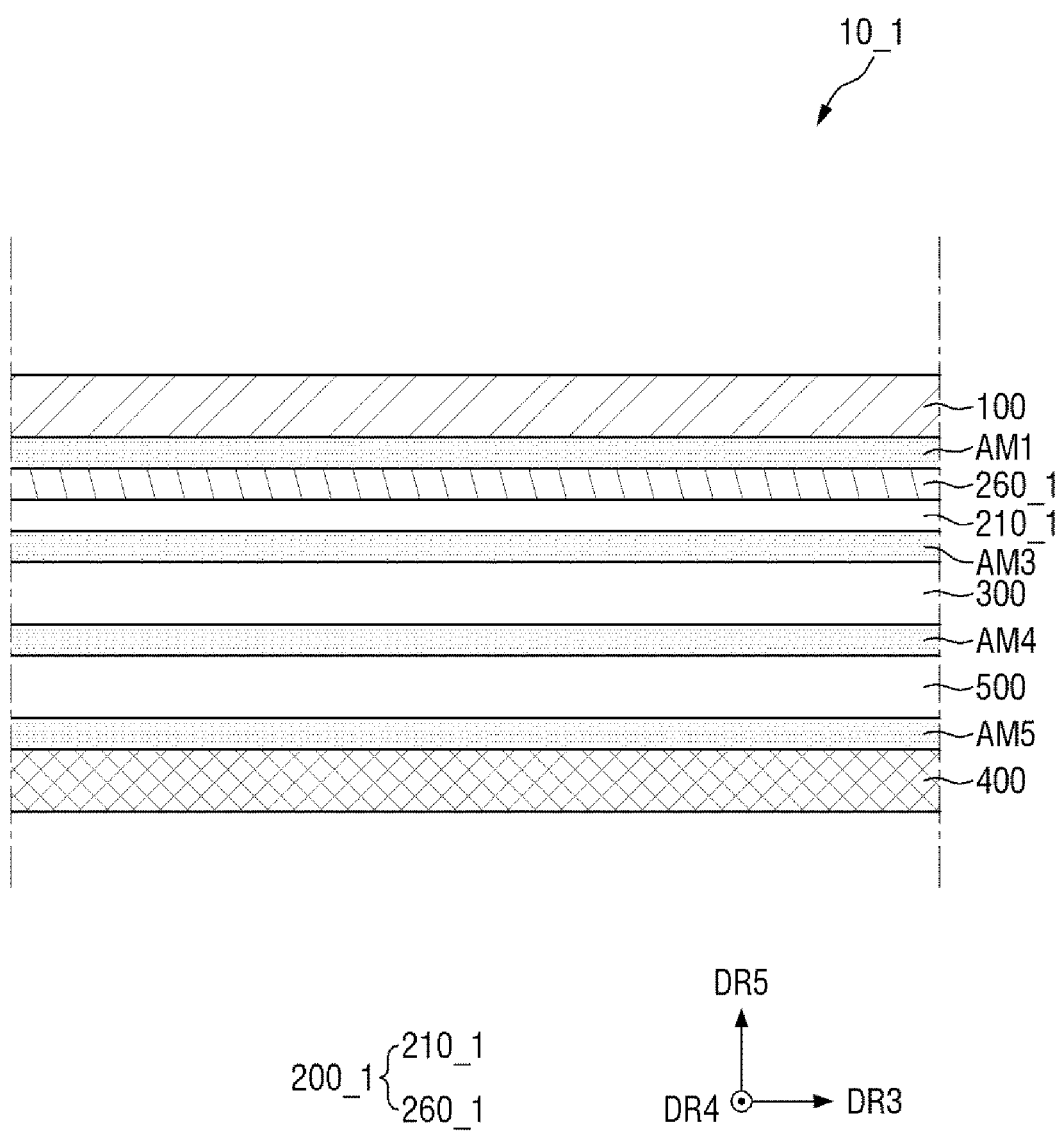
FIG. 9 is a schematic cross-sectional view of a display device according to an embodiment.

FIG. 9 is a schematic cross-sectional view of a display device 10_1 accord in to an embodiment.

Referring to FIG. 9, the display device 10_1 according to the embodiment may include a polarizing film 200_1 and an infrared blocking member 600 integrated with each other. Thus, the polarizing film 200_1 may include a material that blocks the transmission of infrared light. The display device 10_1 of FIG. 9 is the same as the display device 10 of FIG. 7 except that the infrared blocking member 600 provided as a separate member is omitted, and the polarizing film 200_1 includes the infrared blocking material so that a hard coating layer 260_1 of the polarizing film 200_1 includes the infrared blocking member 600. Therefore, any redundant description will be omitted, and differences will be mainly described below. In addition, for ease of description, when a member other than the infrared blocking member 600 includes a material that blocks transmission of infrared light, the member will be described as 'including' the infrared blocking member 600. In this case, it can be understood that the member has the infrared blocking function or the infrared blocking member 600 of FIG. 7 is integrated with the member.

In the display device 10_1 of FIG. 9, the polarizing film 200_1 may include the hard coating layer 260_1 and a polarizer 210_1, and the hard coating layer 260_1 may include a material that blocks transmission of infrared light. For example, in the display device 10_1 of FIG. 9, the hard coating layer 260_1 of the polarizing film 200_1 may include the infrared blocking member 600. Since the hard coating layer 260_1 includes the infrared blocking material, the hard coating layer 260_1 can prevent an infrared light incident from the outside from entering an optical sensor 500. The hard coating layer 260_1 of the polarizing film 200_1 may include an OCR to protect the polarizer 210_1, like the infrared blocking member 600 of FIG. 7. In the polarizing film 200_1 of FIG. 9, a metal, an oxide of the same, or a dye which is an infrared blocking material may be mixed with the hard coating layer 260_1, and the hard coating layer 260_1 may function to block transmission of infrared light.

According to the embodiment, in the display device 10_1, since the infrared blocking member 600 is integrated with the polarizing film 200_1, a second adhesive member AM2 for bonding the infrared blocking member 600 and the polarizing film 200_1 may be omitted.

As described above, in the infrared blocking member 600, an infrared blocking material dispersed in a resin may include a metal, an oxide of the same, or a dye. Each adhesive member AM may include an OCA, an OCR, or a PSA to include a resin in which an infrared blocking material can be dispersed. In an exemplary embodiment, each adhesive member AM may include an infrared blocking material to block infrared light from entering the optical sensor 500. For example, the infrared blocking member 600 may be integrated with each adhesive member AM.

Figure 10:
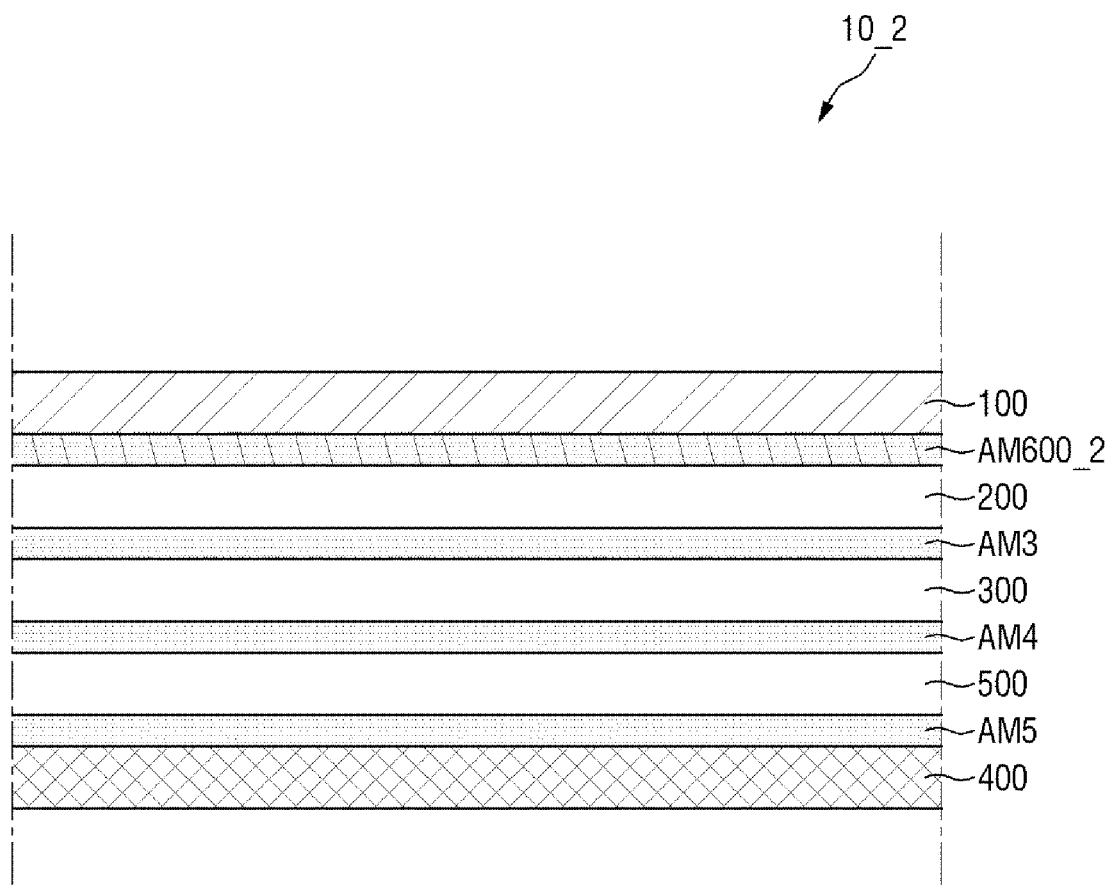
FIGS. 10 and 11 are schematic cross-sectional views of display devices according to embodiments.
Figure 11:
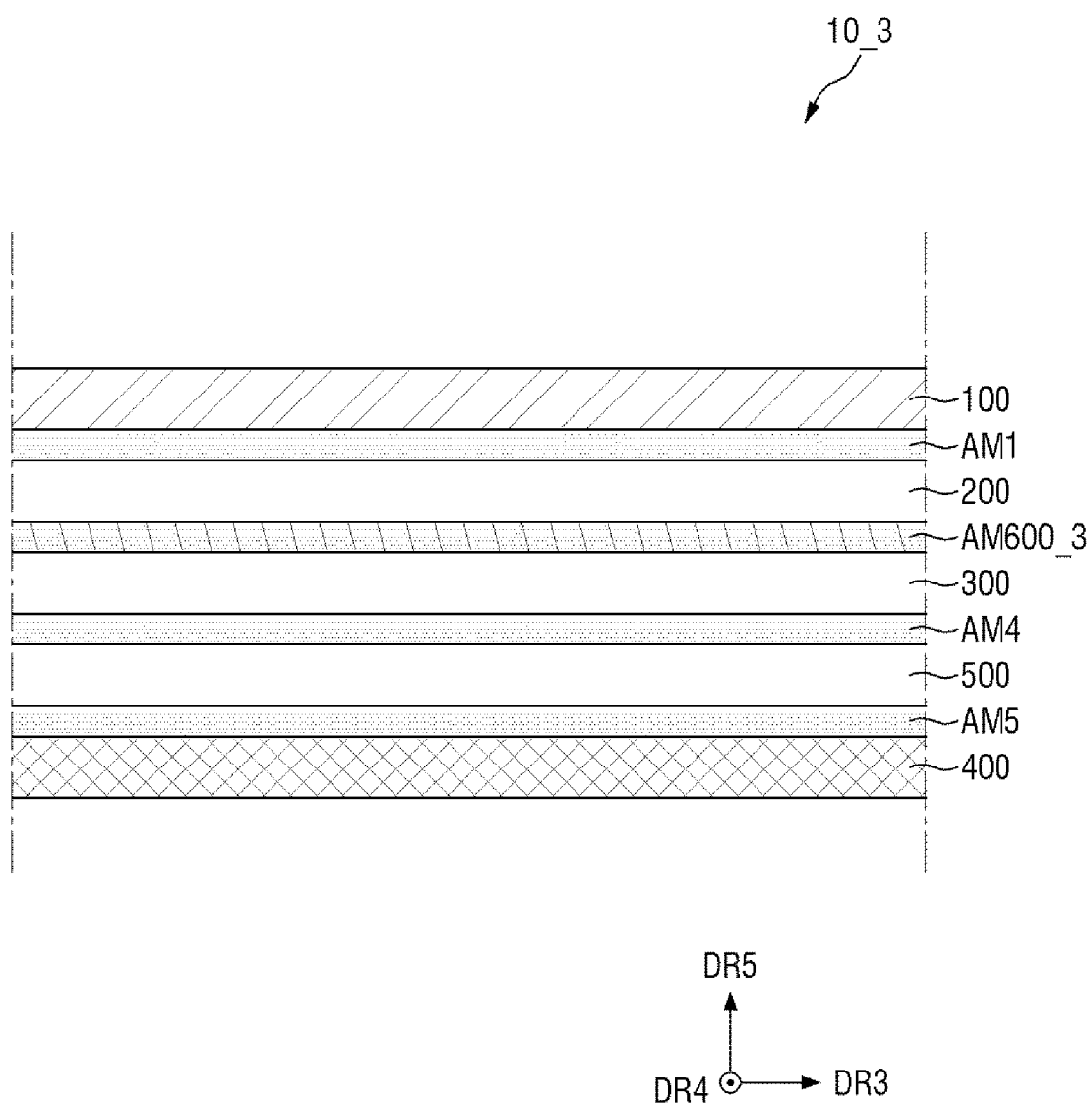

FIGS. 10 and 11 are schematic cross-sectional views of display devices 10_2 and 10_3 according to embodiments.

Referring to FIGS. 10 and 11, the display devices 10_2 and 10_3 according to the embodiments may respectively include adhesive members A600_2 and AM600_3 including an infrared blocking material. The infrared blocking member 600 of FIG. 7 may be omitted, and the adhesive members AM600_2 and AM600_3 of FIGS. 10 and 11 may be integrated with the infrared blocking member 600. In FIG. 10, the adhesive member AM6002 is integrated with the infrared blocking member 600. The adhesive member AM600_2 may be between a cover window 100 and a polarizing film 200. In FIG. 11, the adhesive member AM600_3 between a polarizing film 200 and a display panel 300 is integrated with the infrared blocking member 600. FIG. 10 will now be described as an example, and it is obvious that the same description is applicable to the case of FIG. 11.

In the display device 10_2 of FIG. 10, the adhesive member AM600_2, used for bonding the cover window 100 and the polarizing film 200, may include a material that blocks transmission of infrared light. For example, the adhesive member AM600_2 may include the infrared blocking member 600 or may be integrated with the infrared blocking member 600.

The adhesive member AM600_2 may include an OCR or a PSA, and the infrared blocking material may be mixed with the OCR or the PSA. Accordingly, in the display device 10_2 of FIG. 10, the adhesive member AM600_2 may perform the infrared blocking function to prevent external infrared light from entering an optical sensor 500.

In the display device 10_3 of FIG. 11, the adhesive member AM600_3 for bonding the polarizing film 200 and the display panel 300 may perform the infrared blocking function. For example, the adhesive member AM600_3 may include the infrared blocking member 600. In this case, the adhesive member AM600_3 performing the function of the infrared blocking member 600 may be disposed between the polarizing film 200 and the display panel 300.

Figure 12:
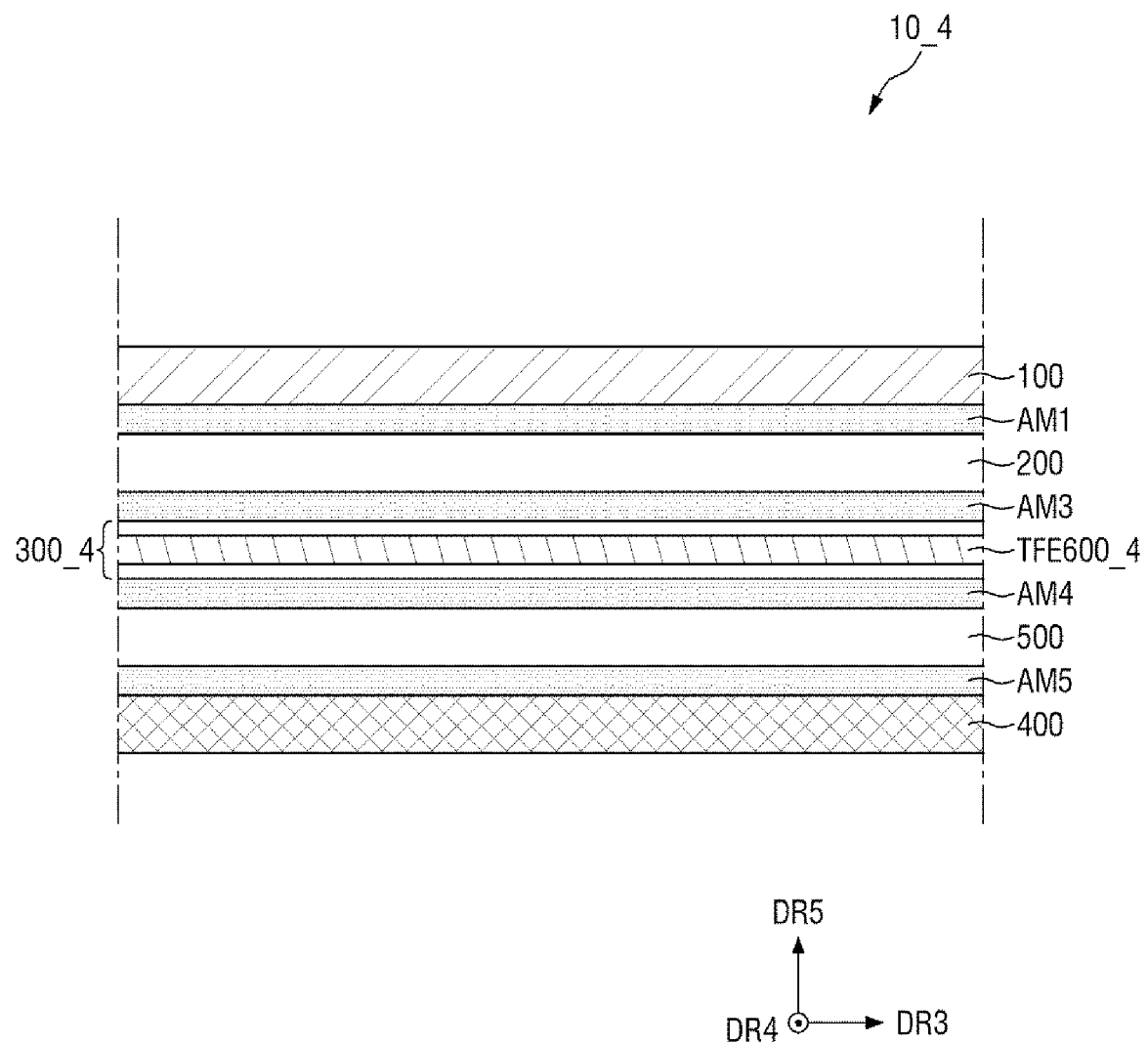
FIG. 12 is a schematic cross-sectional view of a display device according to an embodiment.
Figure 13:
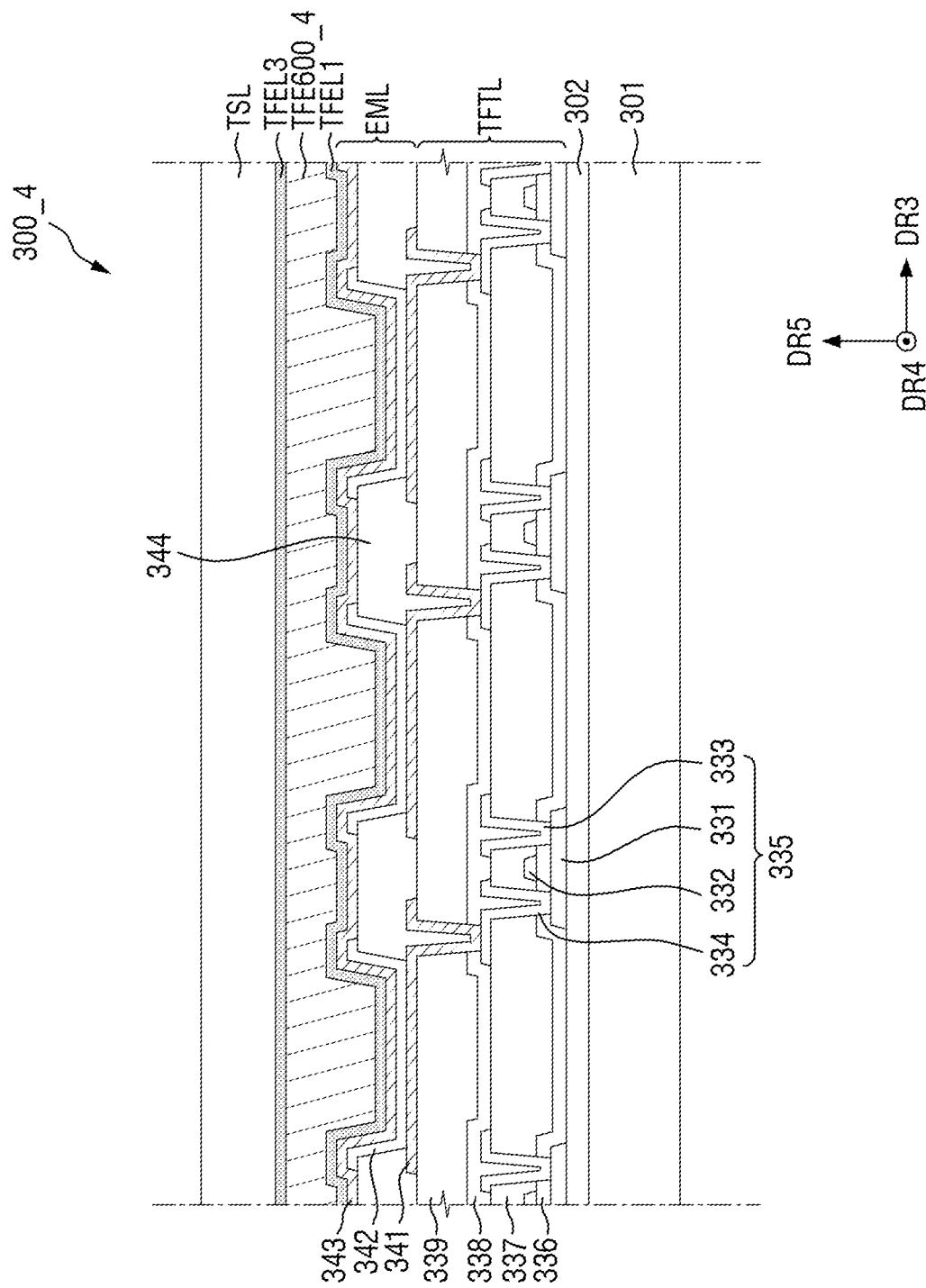
FIG. 13 is a schematic cross-sectional view of a display panel of the display device of FIG. 12.

FIG. 12 is a schematic cross-sectional view of a display device 10_4 according to an embodiment. FIG. 13 is a schematic cross-sectional view of a display panel 300_4 of the display device 10_4 of FIG. 12.

Referring to FIGS. 12 and 13, in the display device 10_4 according to the embodiment, the display panel 300_4 and an infrared blocking member 600 may be integrated with each other. In an exemplary embodiment, an encapsulating organic layer TFE600_4 of a thin-film encapsulation layer TFEL of the display panel 300_4 may include a material that blocks transmission of infrared light. For example, the thin-film encapsulation layer TFEL of the display panel 300_4 may include the infrared blocking member 600. In this case, the encapsulating organic layer TFE600_4 performing the function of the infrared blocking member 600 may be disposed between a touch member TSL and a light-emitting element layer EML of the display panel 300_4 in the display device 10_4.

Since an optical sensor 500 is disposed under the display panel 300_4, the infrared blocking member 600 may be disposed not necessarily on the display panel 300_4. For example, the infrared blocking member 600 can be disposed at any position between the optical sensor 500 and a cover window 100 as long as the infrared blocking member 600 overlaps the optical sensor 500 in the thickness direction, for example, in the third direction DR5.

Figure 14:
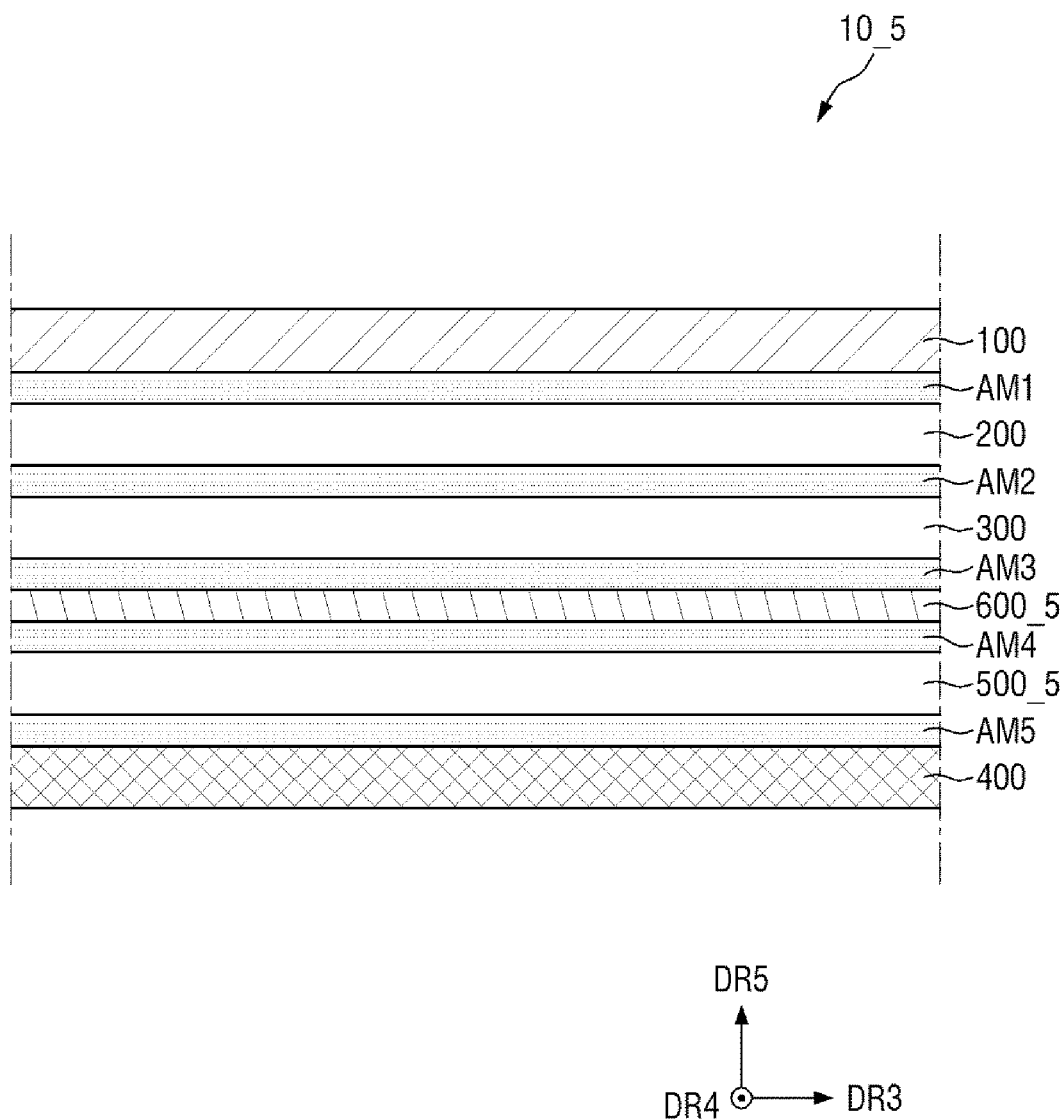
FIGS. 14 and 15 are schematic cross-sectional views of display devices according to embodi merits.
Figure 15:
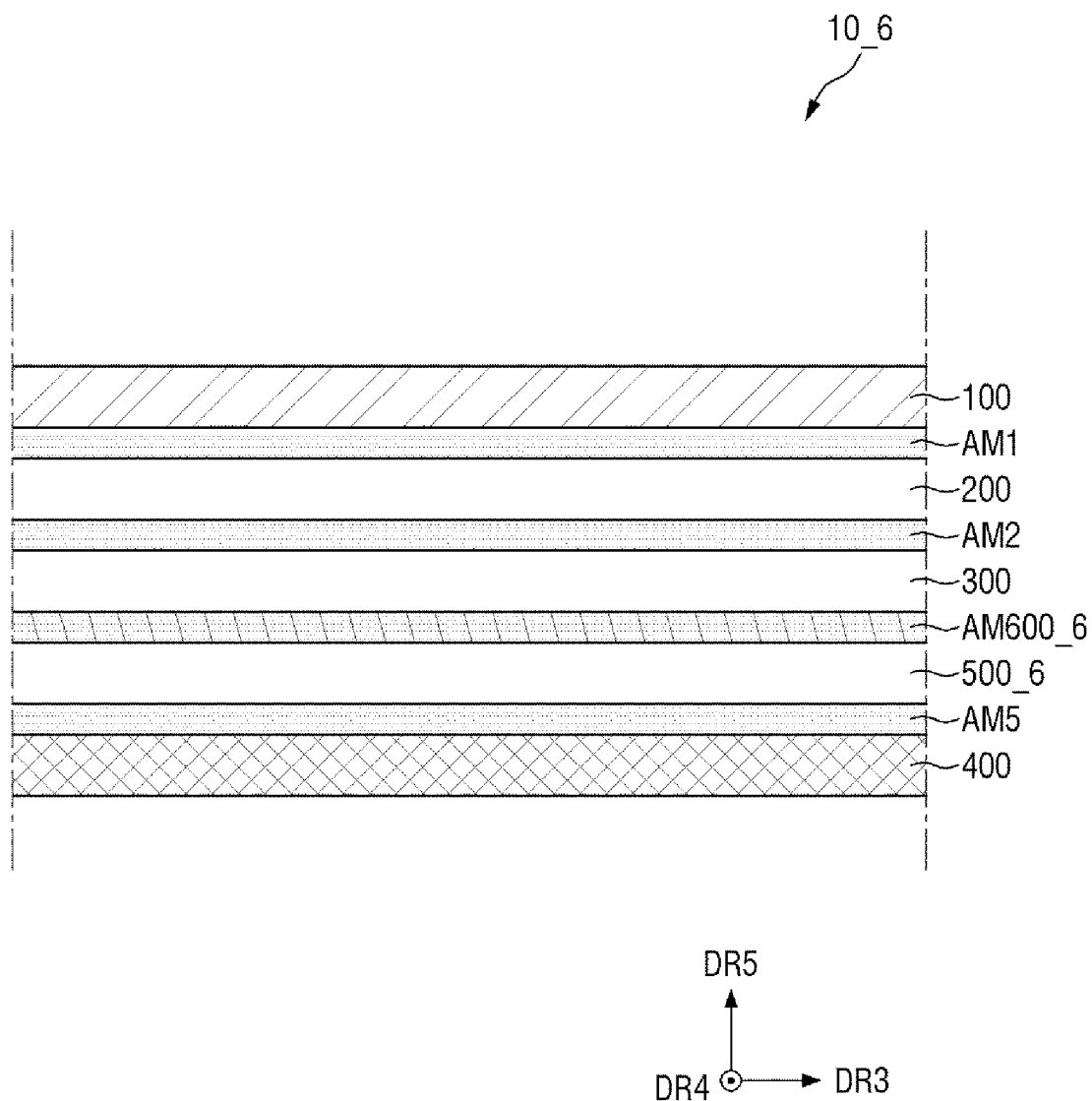

FIGS. 14 and 15 are schematic cross-sectional views of display devices 10_5 and 10_6 according to embodiments.

First, referring to FIG. 14, the display device 10_6 may include an infrared blocking member 600_5 disposed between a display panel 300 and an optical sensor 500_5. The infrared blocking member 600_5 may be bonded to under the display panel 300 by a third adhesive. member AM3 and may be bonded to the optical sensor 500_5 by a fourth adhesive member AM4. In the display device 10_6 of FIG. 14, the infrared blocking member 600_5 may be disposed relatively adjacent to the optical sensor 500_5, unlike in the display devices 10 described above. The infrared blocking member 600_5 may overlap the optical sensor 500_5 to block infrared light from entering the optical sensor 500_5.

In the display device 10_6 of FIG. 15, an infrared blocking member 600 is integrated with an adhesive member AM600_6 for bonding a display panel 300 and an optical sensor 500_6. Since this case is the same as that described above, a detailed description thereof is omitted.

The optical sensor 500_6 may not necessarily be disposed under the whole of the display panel 300 but may be disposed under a part of the display panel 300. In this case, a fingerprint recognition area FA may be formed in a part of a display area DA to correspond to the optical sensor 500_6.

Figure 16:
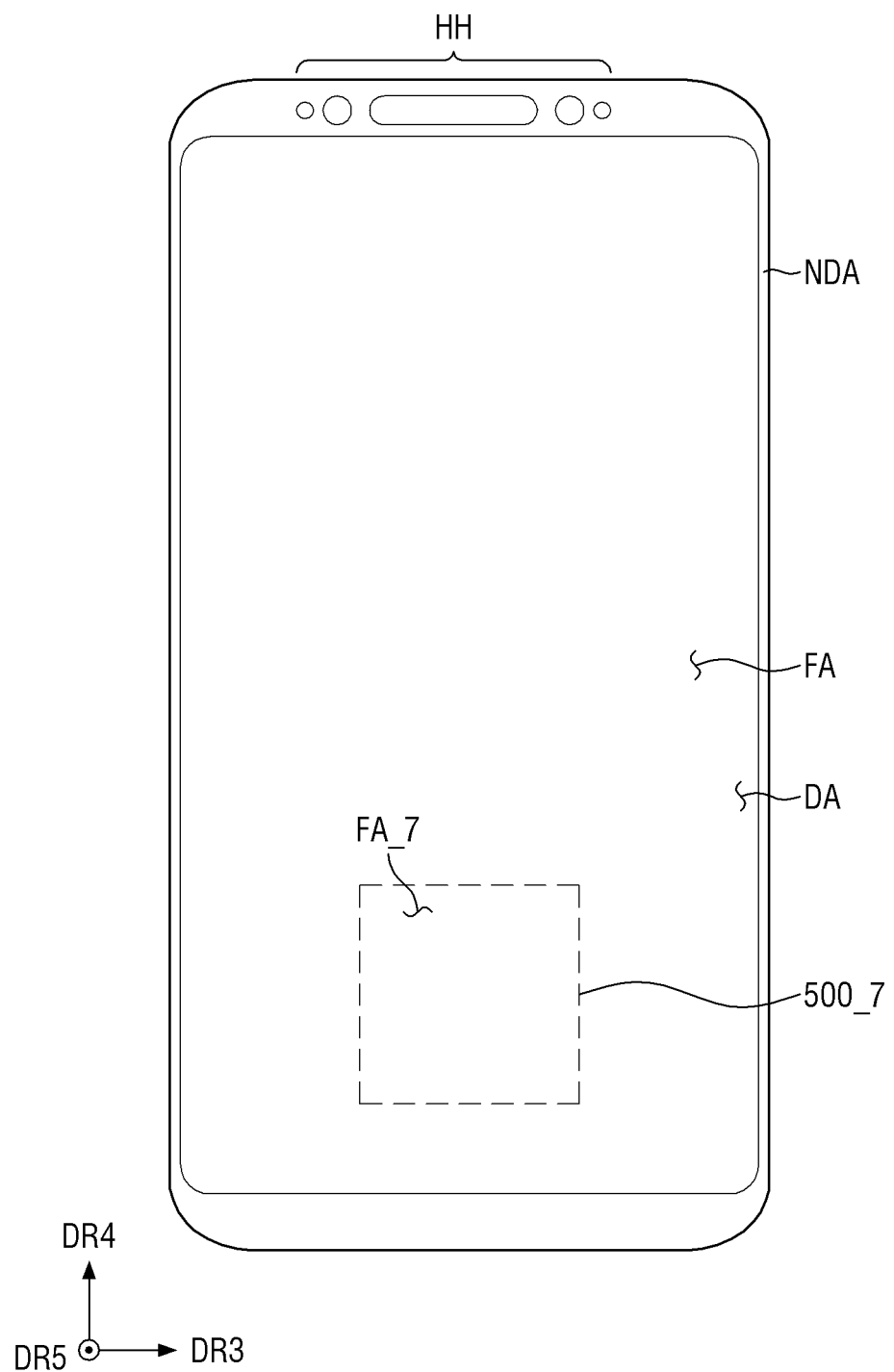
FIG. 16 is a plan view schematically illustrating a fingerprint recognition area of a display device according to an embodiment.
Figure 17:
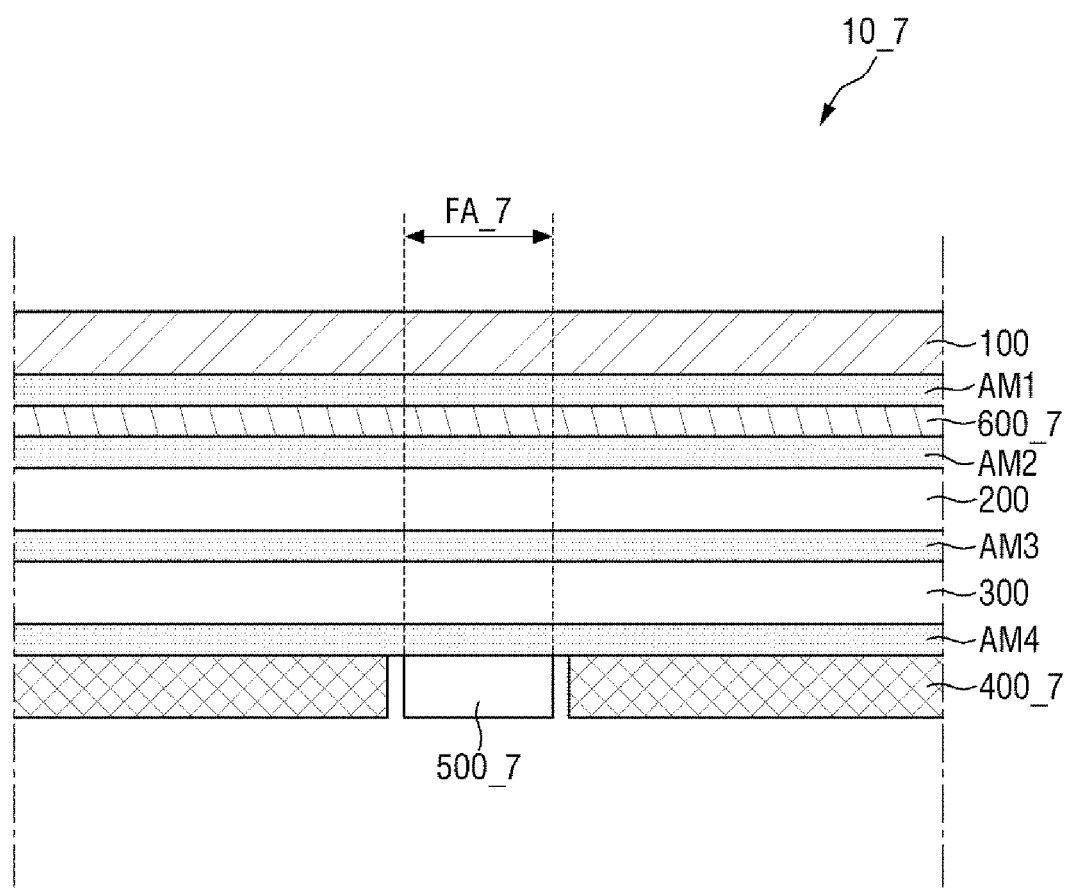
FIGS. 17 and 18 are schematic cross-sectional views of the display device of FIG. 16.
Figure 18:
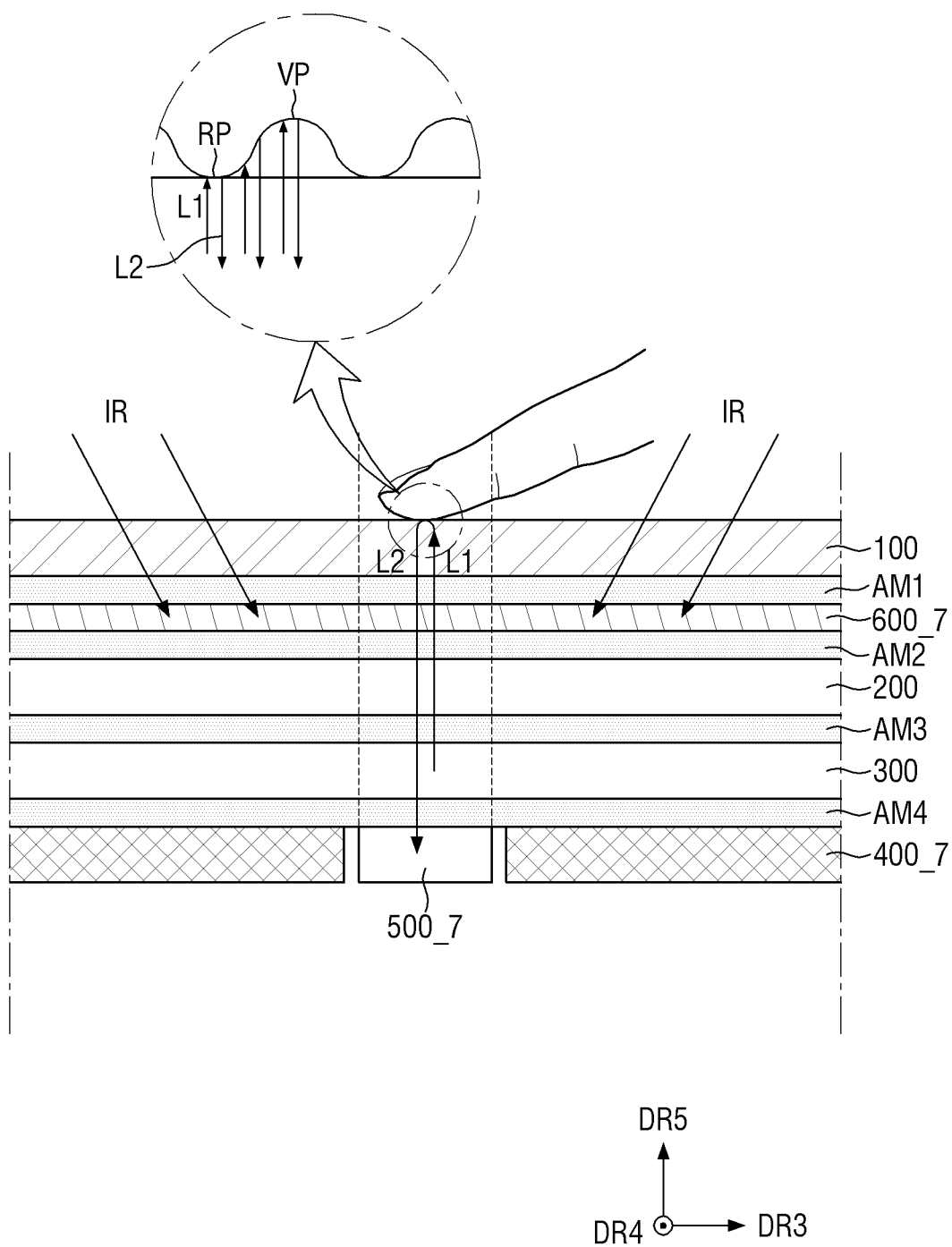

FIG. 16 is a plan view schematically illustrating a fingerprint recognition area FA_7 of a display device 10_7 according to an embodiment, FIGS. 17 and 18 are schematic cross-sectional views of the display device 10_7 of FIG. 16.

Referring to FIGS. 16 through 18, in the display device 10_7 according to the embodiment, an under-panel member 400_7 may include an opening that partially exposes a fourth adhesive member AM4, and an optical sensor 500_7 may be disposed under a display panel 300 and in the opening. Accordingly, the fingerprint recognition area FA_7 may not be formed in the entire display area DA of the display device 10_7. The fingerprint recognition area FA_7 may be formed in a part of the display area DA corresponding to an area where the optical sensor 500_7 is disposed.

Embodiments are not limited to the fingerprint recognition area FA_7 disposed adjacent to a lower surface of the display device 10_7, for example, adjacent to the other side in the second direction DR4 in the drawings. The fingerprint recognition area FA_7 may vary according to the position of the optical sensor 500_7. For example, the fingerprint recognition area FA_7 may vary according to the position of the opening in the under-panel member 400_7. The display device 10_7 of FIGS. 16 through 18 is the same as the display device 10 of FIGS. 6 through 8 except that the fingerprint recognition area FA_7 is disposed in a part of the display area DA because the optical sensor 500_7 is disposed in the opening of the under-panel member 400_7.

The display device 10_7 may sense a user's fingerprint input in the fingerprint recognition area FA_7 through the optical sensor 500_7, since the fingerprint recognition area FA_7 overlapping the optical sensor 500_7 is reduced. If the optical sensor 500_7 is disposed under a part of the display panel 300, an infrared blocking member 600_7 disposed between the optical sensor 500_7 and a cover window 100 may prevent infrared light IR incident from the outside from entering the optical sensor 500_7. In particular, since the infrared blocking member 600_7 partially overlaps the optical sensor 500_7 and is disposed in a wider area than the optical sensor 500_7, infrared light incident on the optical sensor 500_7 can be minimized.

Figure 19:
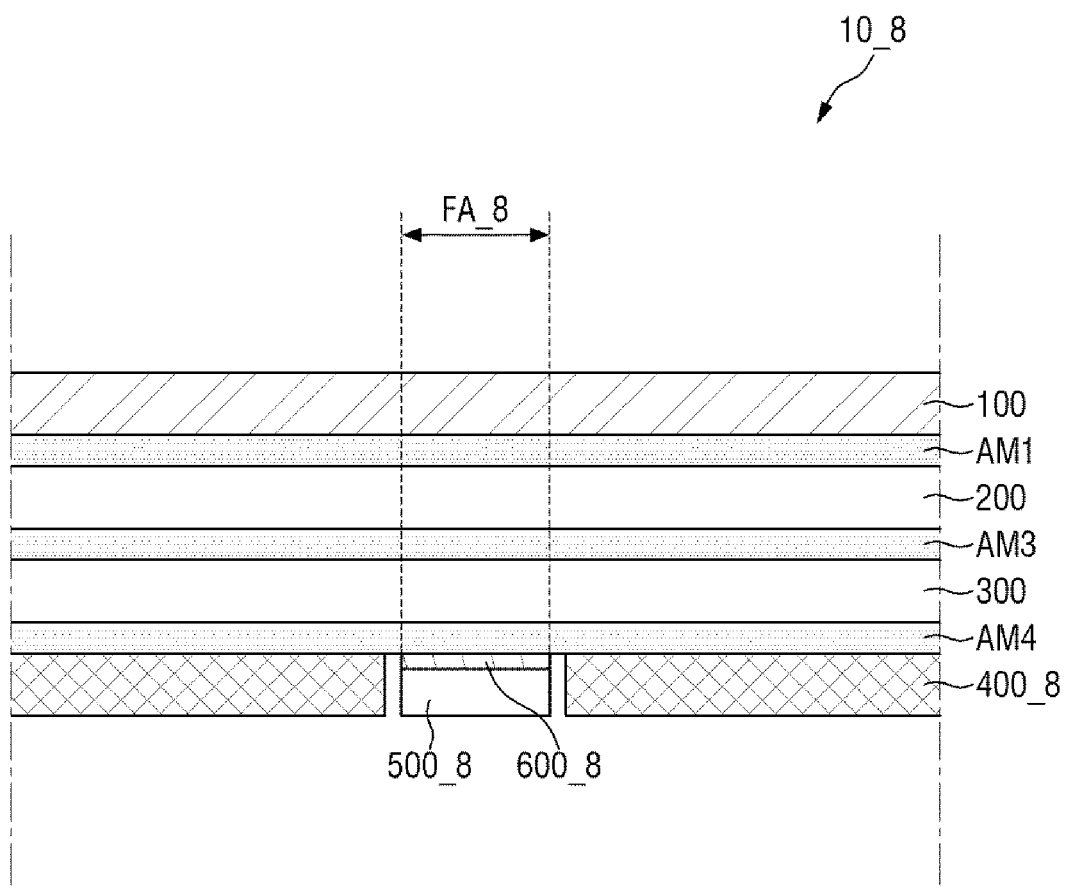
FIGS. 19 and 20 are schematic cross-sectional views of a display device according to art embodiment.
Figure 20:
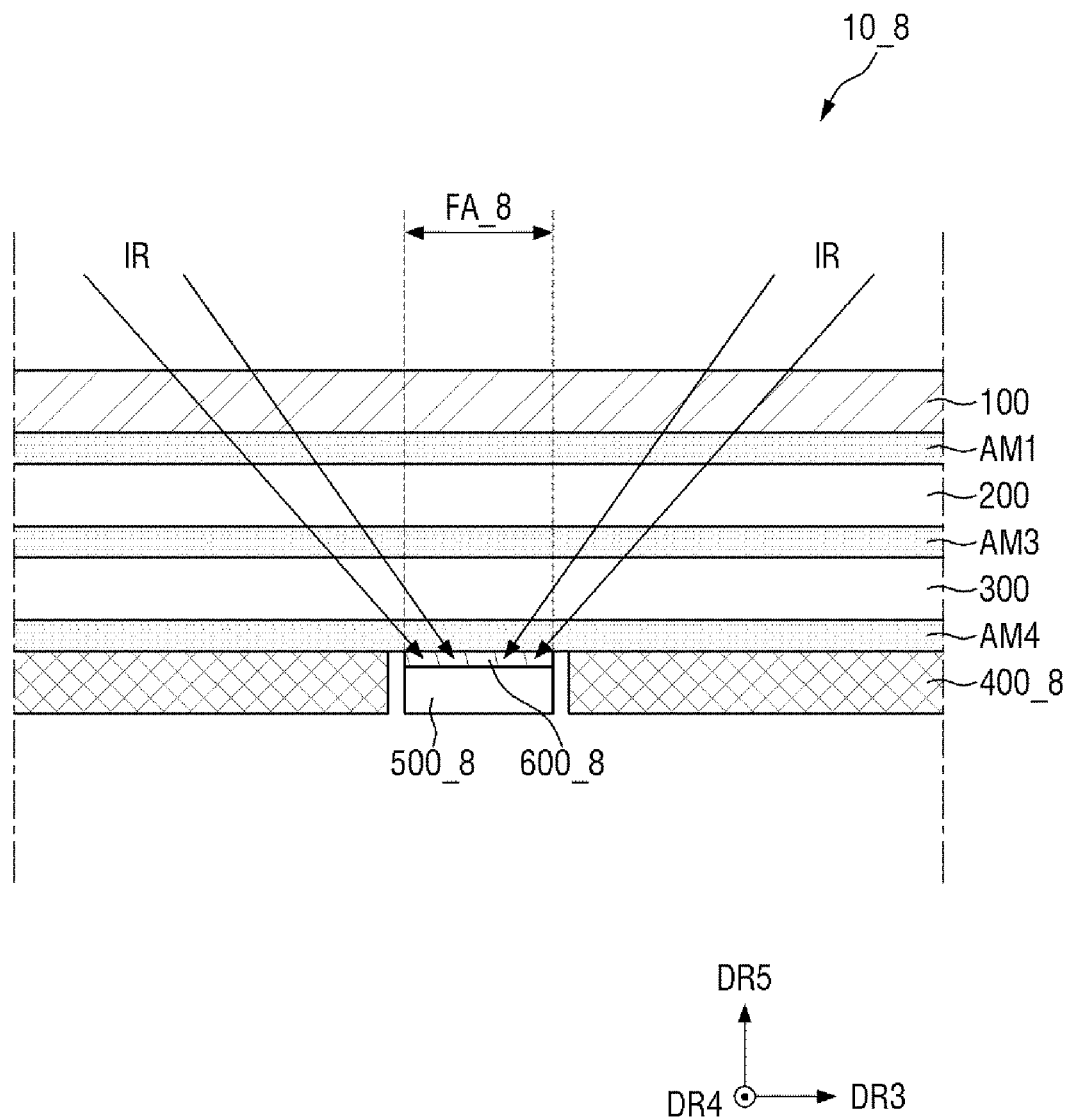

FIGS. 19 and 20 are schematic cross-sectional views of a display device 10_8 according to an embodiment.

Referring to FIGS. 19 and 20, in the display device 10_8 according to the embodiment, an infrared blocking member 600_8 may be disposed in an opening of an under-panel member 400_8 and may be disposed on an optical sensor 500_8. For example, the infrared blocking member 600_8 may be disposed between the optical sensor 500_8 and a cover window 100 and disposed in an area overlapping the optical sensor 500_8.

In this case, the infrared blocking member 600_8 may block a portion of infrared light IR incident on the display device 10_8. However, since the infrared blocking member 600_8 is disposed directly on the optical sensor 500_8, the infrared light IR incident from outside the display device 10_8 can be prevented from entering the optical sensor 500_8.

A display device according to an embodiment includes an optical sensor disposed under a display panel and forms a fingerprint recognition area in a display area and an infrared blocking member which blocks infrared light from entering the optical sensor. The infrared blocking member is disposed between the optical sensor and a cover window and, in some cases, may be integrated with an adhesive member, the display panel, a polarizing film, etc. Accordingly, the display device, according to the embodiment, may increase a fingerprint recognition rate of the optical sensor by blocking infrared light from entering the optical sensor.

In concluding the detailed description, those skilled in the art will appreciate that many variations and modifications can be made to the embodiments without substantially departing from the principles of the present invention. Therefore, the disclosed embodiments of the present disclosure are used in a generic and descriptive sense only and not for purposes of limitation.

What is claimed is:

1. A display device comprising:
a display panel;
a cover window disposed above the display panel;
an optical sensor, wherein at least a part of the optical sensor is disposed under the display panel;
an infrared blocking member disposed between the optical sensor and the cover window;
a first adhesive member disposed between the cover window and the display panel;
a second adhesive member disposed between the display panel and the optical sensor, the second adhesive member including a first surface facing the display panel and a second surface opposite to the first surface; and
an under-panel member disposed under the second adhesive member and comprising an opening exposing the second surface of the second adhesive member;
wherein the first adhesive member is disposed between the cover window and the infrared blocking member,
wherein at least a first part of the infrared blocking member overlaps the optical sensor from above the optical sensor, and wherein a first part of the display panel is disposed between the first part of the infrared blocking member and the optical sensor,
wherein at least a second part of the infrared blocking member overlaps the under-panel member from above the under-panel member,
wherein the under-panel member includes an upper surface facing the display panel,
wherein the first surface of the second adhesive member directly contacts the display panel, and
wherein the second surface of the second adhesive member faces the optical sensor and the upper surface of the under-panel member.

2. The display device of claim 1, comprising:
a display area and a non-display area outside the display area; and
a fingerprint recognition area which overlaps the optical sensor from above the optical sensor.

3. The display device of claim 2, wherein the fingerprint recognition area is disposed in the display area.

4. The display device of claim 2, further comprising a polarizing film disposed between the display panel and the cover window.

5. The display device of claim 4, wherein the infrared blocking member is disposed between the polarizing film and the cover window.

6. The display device of claim 4, wherein the display panel comprises a light emitting layer, a thin-film encapsulation layer disposed on the light emitting layer and a touch member disposed on the thin-film encapsulation layer of the display panel.

7. The display device of claim 6, further comprising a third adhesive member disposed between the display panel and the polarizing film.

8. The display device of claim 2, wherein the infrared blocking member comprises a material that blocks transmission of infrared light and prevents light whose center wavelength ranges from 780 nm to 2500 nm from entering the optical sensor.

9. The display device of claim 8, wherein the infrared blocking member comprises a metal or a metal oxide.

10. The display device of claim 9, wherein the metal or the metal oxide has a diameter of 1 nm to 100 nm.

11. The display device of claim 10, wherein the metal or the metal oxide is nickel (Ni), chromium (Cr), niobium (Nb), tantalum (Ta), iridium (Ir), vanadium (V), or an oxide of the same.

12. The display device of claim 8, wherein the infrared blocking member comprises at least any one of a diimmonium-based dye, a polymethine-based dye, an anthraquinone-based dye, a phthalocyanine-based dye, a naphthalocyanine-based dye, and a thiol-nickel complex.

13. A display device comprising:
a display panel;
a cover window disposed above the display panel;
an adhesive member disposed under the display panel, the adhesive member including a first surface facing the display panel and a second surface opposite to the first surface;
an under-panel member disposed under the adhesive member and comprising an opening exposing the second surface of the adhesive member across an entire length of the opening, wherein the adhesive member bonds the under-panel member and the display panel together in one or more areas other than the opening;

an optical sensor disposed under the display panel in the opening of the under-panel member, wherein two opposite vertical edges of the optical sensor are aligned with two sides of a fingerprint area, respectively, in a cross-sectional view; and an infrared blocking member disposed between the optical sensor and the second surface of the adhesive member in the opening, the infrared blocking member spaced apart from the under-panel member, wherein two opposite vertical edges of the infrared blocking member are aligned with the two sides of the fingerprint area, respectively, in the cross-sectional view, wherein at least a part of the infrared blocking member overlaps the optical sensor from above the optical sensor, and the optical sensor is disposed in the opening of the under-panel member, wherein the under-panel member is located outside the fingerprint area in the cross-sectional view, wherein the under-panel member includes an upper surface facing the display panel, wherein the first surface of the adhesive member directly contacts the display panel, and wherein the second surface of the adhesive member faces the infrared blocking member and the upper surface of the under-panel member, wherein the second surface of the adhesive member comprises a first portion which overlaps the under-panel member and does not overlap any one of the optical sensor and the infrared blocking member, a second portion which overlaps the infrared blocking member and does not overlap the under-panel member, and a third portion disposed between the first portion of the second surface of the adhesive member and the second portion of the second surface of the adhesive member, and wherein the third portion of the second surface of the adhesive member does not overlap any one of the under-panel member, the optical sensor and the infrared blocking member.

14. The display device of claim 13, wherein the infrared blocking member comprises a material that blocks transmission of infrared light and prevents light whose center wavelength ranges from 780 nm to 2500 nm from entering the optical sensor.

15. The display device of claim 13, wherein the infrared blocking member is substantially the same length as the optical sensor across the length of the opening.

16. A display device comprising:
a display panel;
a cover window disposed above the display panel;
an optical sensor, wherein at least a part of the optical sensor is disposed under the display panel;
an infrared blocking member disposed between the optical sensor and the cover window;
a first adhesive member disposed between the cover window and the display panel;
a second adhesive member disposed between the display panel and the optical sensor, the second adhesive member including a first surface facing the display panel and a second surface opposite to the first surface; and
an under-panel member disposed under the second adhesive member and comprising an opening exposing the second surface of the second adhesive member;
wherein the first adhesive member is disposed between the cover window and the infrared blocking member,
wherein at least a first part of the infrared blocking member overlaps the optical sensor from above the optical sensor, and wherein a first part of the display panel is disposed between the first part of the infrared blocking member and the optical sensor,
wherein a second part of the infrared blocking member does not overlap the optical sensor,
wherein a second part of the display panel is disposed between the second part of the infrared blocking member and the under-panel member,
wherein the under-panel member includes an upper surface facing the display panel,
wherein the first surface of the second adhesive member directly contacts the display panel, and
wherein the second surface of the second adhesive member faces the optical sensor and the upper surface of the under-panel member.

17. The display device of claim 16, wherein the second part of the infrared blocking member overlaps the under-panel member from above the under-panel member.

* * * * *